United States Patent
Hasegawa et al.

(10) Patent No.: US 6,862,158 B2
(45) Date of Patent: Mar. 1, 2005

(54) EXCHANGE COUPLING FILM HAVING IMPROVED WETTABILITY OF SEED LAYER

(75) Inventors: Naoya Hasegawa, Niigata-ken (JP); Masamichi Saito, Niigata-ken (JP); Kenichi Tanaka, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 63 days.

(21) Appl. No.: 10/197,654

(22) Filed: Jul. 17, 2002

(65) Prior Publication Data

US 2003/0063415 A1 Apr. 3, 2003

(30) Foreign Application Priority Data

Jul. 19, 2001 (JP) ........................................ 2001-219426

(51) Int. Cl.⁷ ............................................. G11B 5/39
(52) U.S. Cl. ............................................. 360/324.11
(58) Field of Search ....................... 360/324.11, 324.12, 360/324.1, 324, 317

(56) References Cited

U.S. PATENT DOCUMENTS

| | | | |
|---|---|---|---|
| 6,219,210 B1 * | 4/2001 | Pinarbasi ............... | 360/324.11 |
| 6,313,973 B1 * | 11/2001 | Fuke et al. .............. | 360/324.1 |
| 6,338,899 B1 * | 1/2002 | Fukuzawa et al. .......... | 428/332 |
| 6,462,920 B1 * | 10/2002 | Karimi .................. | 360/327.31 |
| 6,574,060 B2 * | 6/2003 | Kanbe et al. ................. | 360/55 |
| 6,636,400 B2 * | 10/2003 | Pinarbasi et al. ...... | 360/324.12 |
| 6,700,753 B2 * | 3/2004 | Singleton et al. ........ | 360/324.1 |

FOREIGN PATENT DOCUMENTS

JP          2000-22239          1/2000

* cited by examiner

*Primary Examiner*—Angel Castro
(74) *Attorney, Agent, or Firm*—Brinks Hofer Gilson & Lione

(57) ABSTRACT

A seed layer is formed of a Cr film with a thickness of 15 Å or more and 50 Å or less comprising at least partially an amorphous phase, thereby enabling wettability of the surface the seed layer to be remarkably improved as compared with conventional one, the unidirectional bias magnetic field in the pinned magnetic layer to be increased, and the surface of each layer on the seed layer to have good lubricity.

30 Claims, 14 Drawing Sheets

30.0 nm

Ta(12)/Ni Fe 86(r(15) Seed

EXCHANGE COUPLING FILM HAVING IMPROVED WETTABILITY OF SEED LAYER

BACKGROUND OF THE INVENTION

1. Field of the Invention

The present invention relates to an exchange coupling film comprising, from the bottom to the top, a seed layer, an antiferromagnetic layer and a ferromagnetic layer in which the magnetization direction of the ferromagnetic layer is aligned in a given direction due to an exchange coupling magnetic field generated at the interface between the antiferromagnetic layer and ferromagnetic layer, and to a magnetic sensing element (such as a spin-valve type thin film element and an AMR element) using the exchange coupling film. In particular, the present invention relates to an exchange coupling film capable of more properly improving electromigration resistance in high density recording in the future as compared with that in the related art, while enabling a favorable rate of change of resistance to be obtained, and to a magnetic sensing element using the exchange coupling film.

2. Description of the Related Art

FIG. 15 shows a partial cross section of a conventional magnetic sensing element (spin-valve type thin film element) cut from a direction parallel to an opposed face to a recording medium.

The reference numeral 14 shown in FIG. 15 denotes a seed layer made of, for example, a NiFeCr alloy. An antiferromagnetic layer 30, a pinned magnetic layer 31, a nonmagnetic layer 32, a free magnetic layer 33 and a protective layer 7 are sequentially laminated on the seed layer 14.

An exchange coupling magnetic field is generated in this type of the spin-valve type thin film element at an interface between the antiferromagnetic layer 30 and pinned magnetic layer 31 by a heat treatment, and magnetization of the pinned magnetic layer 31 is fixed in the height direction (the Y-direction in the drawing).

Hard bias layers 5 are formed at both sides of the multilayer from the seed layer 14 to the protective layer 7 as shown in FIG. 15. Magnetization of the free magnetic layer 33 is aligned in the track width direction (the X-direction in the drawing) by a longitudinal bias magnetic field from the hard bias layer 5.

As shown in FIG. 15, an electrode layer 8 is formed so as to cover the hard bias layer 5. A sense current from the electrode layer 8 mainly flows through three layers of the pinned magnetic layer 31, non-magnetic layer 32 and free magnetic layer 33.

The seed layer 14 is formed under the antiferromagnetic layer 30 in the spin-valve type thin film element shown in FIG. 15, because improvements of electromigration resistance represented by the electromigration resistance and the rate of, change of resistivity could be expected by providing the seed layer 14.

It has been emphasized in the related art that the crystal structure of the seed layer 14 is a face-centered cubic structure (a fcc structure).

Layers formed on the seed layer 14 may be properly oriented in the [111] direction and the crystal grain size may be increased when the seed layer 14 takes the face-centered cubic structure. As a result, electric conductance may be increased while increasing the exchange coupling magnetic field generated between the pinned magnetic layer 31 and antiferromagnetic layer 30 to enable improved electromigration resistance to be expected.

The seed layer 14 has been formed with the NiFeCr alloy with a Cr composition ratio of 40 at %, in order to maintain the crystal structure of the seed layer 14 as the face-centered cubic structure.

However, the sense current density flowing through the spin-valve type thin film element has increased as the spin-valve type thin film element is compacted for complying with high density recording in the future, thereby causing a problem of electromigration.

The inventors of the present invention have thought it important to contemplate improving wettability of the surface of the seed layer 14 in contact with the antiferromagnetic layer 30 for solving the problems as hitherto described. It was conjectured that each atom in an antiferromagnetic material constituting the antiferromagnetic layer 30 may be hardly coagulated on the seed layer 14 having good wettability when the antiferromagnetic layer 30 is deposited on the seed layer 14 by sputtering, which results in a large crystal grain diameter to enable the exchange coupling magnetic field generated between the antiferromagnetic layer 30 and pinned magnetic layer 31 and the rate of change of resistance to be increased.

While the larger the composition ratio of Cr incorporated in the seed layer 14 is supposed to be better for improving wettability, increasing the composition ratio of Cr too much may result in precipitation of a body-centered cubic structure (bcc structure) mingled with the face-centered cubic structure (fcc structure) with less improvement of wettability than expected. Consequently, the exchange coupling magnetic field generated between the pinned magnetic layer 31 and antiferromagnetic layer 30 rather decreases to make it impossible to improve electromigration resistance, which is represented by electron migration resistance, as well as the rate of change of resistance.

Electromigration resistance and the rate of change of resistance were forced to be decreased unless the composition ratio of Cr is adjusted to be 40 at % or less, when the seed layer 14 is formed of the NiFeCr alloy as in the related art. Furthermore, it was revealed that using the NiFeCr alloy for the seed layer 14 makes it difficult to contemplate obtaining a higher exchange coupling magnetic field for further improving electromigration resistance and the rate of change of resistance in compliance with high recording density in the future.

In addition, using the NiFeCr alloy (with a Cr composition ratio of 40 at % or less) in the seed layer 14 have caused the following problems because lubricity of the surface of the antiferromagnetic layer 30 decreases due to undulations generated between crystal grain boundaries on the surface of the antiferromagnetic layer 30.

FIG. 16 illustrates a partially magnified drawing of the structure of the magnetic sensing element shown in FIG. 15. The seed layer 14 shown in FIG. 16 is formed of the NiFeCr alloy with a Cr composition ratio of 40 at % or less.

FIG. 16 shows the surface 30a having undulations between the crystal grain boundaries formed on the antiferromagnetic layer 30. These undulations also appear on the surfaces of the pinned magnetic layer 31, nonmagnetic layer 32 and free magnetic layer 33 formed on the antiferromagnetic layer 30.

Magnetic poles are generated at undulated portions on the surface of the pinned magnetic layer 31 as shown in FIG. 17 (a schematic cross section obtained by cutting the pinned magnetic layer 31, nonmagnetic layer 32 and free magnetic layer 33 in the Y-direction shown in FIG. 16) by generation of undulations as described above. The magnetic poles also appear at undulated portions of the free magnetic layer 33 opposed to the pinned magnetic layer 31 with intervention of the nonmagnetic layer 32, thereby increasing an interlayer coupling magnetic field (Hin) caused by a static magnetic coupling (topological coupling) between the pinned magnetic layer 31 and free magnetic layer 33. Accordingly, an action for magnetizing in the Y direction is exerted on the free magnetic layer 33 that should be naturally magnetized in the X-direction, causing a problem that asymmetry in the regenerative waveform is increased.

When a specular reflection layer is formed on the free magnetic layer 33 formed of, for example, an oxide of Ta, on the other hand, lubricity of the surface of the specular reflection layer is also inhibited by being affected by the undulation of the surface 30a of the antiferromagnetic layer 30 to decrease specular reflectivity of the specular reflection layer, making it impossible to expect increased rate of change of resistance caused by the specular effect.

The inventors of the present invention have presumed that the problems arising from surface undulation on the surface of each layer formed on the seed layer 14 comes from poor wettability of the seed layer 14 and large crystal grains formed on the seed layer 14.

SUMMARY OF THE INVENTION

Accordingly, the object of the present invention for solving the problems as hitherto described is to provide an exchange coupling film and a magnetic sensing element using the exchange coupling film particularly by forming a seed layer with Cr and by adjusting the thickness of the seed layer, whereby wettability of the seed layer is improved, a larger unidirectional exchange bias magnetic field (Hex*) can be obtained in the ferromagnetic layer while reducing undulation on the surface of each layer as compared with the conventional layers formed on the seed layer using the NiFeCr alloy, and electromigration resistance and the rate of change of resistance can be properly improved.

The present invention provides an exchange coupling film comprising a seed layer, an antiferromagnetic layer and a ferromagnetic layer sequentially laminated from the bottom to the top. The magnetization direction of the ferromagnetic layer is aligned in a given direction by generating an exchange coupling magnetic field at the interface between the antiferromagnetic layer and ferromagnetic layer. The seed layer is formed of Cr and contains an amorphous phase in at least a part thereof.

Different from the related art, the seed layer is formed of Cr in the present invention. While wettability of the seed layer had been considered to be improved by increasing the composition ratio of Cr when the seed layer is formed of a NiFeCr alloy, the exchange coupling magnetic field generated between the antiferromagnetic layer and ferromagnetic layer rapidly decreased, on the contrary, by increasing the composition ratio of Cr to 40 at % or more, and electromigration resistance could not be properly improved.

It was revealed that wettability on the surface of the seed layer could be markedly improved by forming the seed layer as a monolayer of Cr in the present invention, as compared with the conventional seed layer formed of the NiFeCr alloy. Wettability is supposed to be improved partly because the seed layer contains an amorphous layer, since wettability is improved by forming an active surface as a result of an increased surface energy. However, wettability cannot be sufficiently improved merely by forming the seed layer with Cr, and film deposition conditions, particularly the surface temperature of the substrate, the distance between the substrate and target, the Ar gas pressure and sputtering speed in the seed layer forming process also serve as crucial factors.

According to the present invention, each layer such as an antiferromagnetic layer deposited on the seed layer is made to readily perform lamellar growth by remarkably improving wettability of the surface of the seed layer. Consequently, the crystal grain diameter becomes larger, and the unidirectional exchange bias magnetic field (Hex*) in the ferromagnetic layer is more increased as compared with the conventional seed layer made of the NiFeCr alloy.

The unidirectional exchange bias magnetic field (Hex*) as used herein is defined as the magnitude of the external magnetic field when the rate of change of resistance ($\Delta R/R$) decreases to half of its maximum value. The unidirectional exchange coupling magnetic field includes the magnitude of an exchange coupling magnetic field generated between the ferromagnetic layer and antiferromagnetic layer, as well as the magnitude of a coupling magnetic field due to RKKY mutual exchange coupling generated between magnetic layers constituting a laminated ferrimagnetic structure, when the ferromagnetic layer is in the ferrimagnetic structure.

Accordingly, the unidirectional exchange coupling bias magnetic field principally means an exchange coupling magnetic field generated between the ferromagnetic layer and antiferromagnetic layer when the ferromagnetic layer according to the present invention is not in the laminated ferrimagnetic structure, while the unidirectional exchange coupling bias magnetic field principally means a magnetic field as a sum of the exchange coupling magnetic field and the exchange magnetic field in the RKKY mutual exchange coupling.

The ferromagnetic layer may be properly pinned in a given direction by increasing the unidirectional exchange bias magnetic field. Magnetization of the pinned magnetic layer may be fixed in a given direction without being defeated by a magnetic field induced by an electric current flowing through the element or by a demagnetization field generated at the end of a micro-element even in a high temperature environment, thereby enabling electromigration resistance represented by electromigration resistance to be properly improved.

With respect to crystal orientation of each layer, it seems possible to allow each layer on the seed layer to orient in the [111] direction. However, the present invention has been presented by emphasizing remarkable improvement of wettability of the surface of the seed layer rather than improvement of crystal orientation that has been emphasized. Accordingly, the present invention has succeeded in effectively increasing the unidirectional exchange bias magnetic field (Hex*) over the related art, even by sacrificing orientation of each layer such as the antiferromagnetic layer in the [111] direction.

The seed layer according to the present invention partially contains an amorphous phase. Wettability of the surface of the seed layer according to the present invention is remarkably improved by forming the seed layer with Cr, and the atoms in the antiferromagnetic layer become more movable when they are deposited on the seed layer by allowing the amorphous phase to be incorporated in the seed layer to enable the atoms to be more uniformly deposited on the entire surface. In addition, since no large crystal grains are formed on the seed layer, steps are hardly formed at the portions to serve as the crystal grain boundaries due to absence of large crystal grains in the seed layer. Accordingly, undulations on the surface of each layer formed on the seed layer are prevented from being generated, making it possible to properly improve lubricity of the surface.

An interlayer coupling magnetic field (Hin) caused by static magnetic coupling (topological coupling) between the pinned magnetic layer (ferromagnetic layer) and free magnetic layer may become insufficient while reducing asymmetry of the regenerative waveform when the exchange coupling film is used as a magnetic sensing element to be described hereinafter. Moreover, the rate of change of resistance may be improved by improving specular reflectivity of the specular reflection layer formed on the surface of the magnetic sensing element.

According to the exchange coupling film of the present invention, wettability of the seed layer may be remarkably improved while improving lubricity of the surface of each layer formed on the seed layer. Consequently, it is possible to increase the unidirectional exchange coupling bias magnetic field (Hex*) of the ferromagnetic layer while improving electromigration resistance for high density recording required in the future with stabilized regenerative waveform. The rate of change of resistance may be improved to the same level as or higher than that in the conventional art by increasing the crystal grain diameter.

In a preferable aspect of the present invention, an under layer comprising one or plural elements of Ta, Hf, Nb, Zr, Ti, Mo and W is formed under the sheet layer, and the seed layer is preferably formed with a thickness of 15 Å or more and 50 Å or less.

Since the surface of the underlayer formed of Ta and the like has good wettability, a seed layer comprising Cr may be more densely formed on the entire underlayer to enable the surface of the seed layer to be properly improved.

Moreover, it has been experimentally confirmed as will be described hereinafter that the range of the permissible thickness of the seed layer for obtaining a prescribed intensity of the unidirectional exchange bias magnetic field (Hex*) and rate of change of resistance ($\Delta R/R$) of the ferromagnetic layer may be expanded by forming the underlayer as compared with the case where no underlayer is provided.

The upper limit of the thickness of the seed layer is determined to be 50 Å in the present invention because, when the thickness of the seed layer is larger than 50 Å, the proportion of shunt of a sense current increases with large decrease of the rate of change of resistance ($\Delta R/R$), and at least the same level of the rate of change of resistance as obtained in the related art cannot be obtained. The seed layer also contains a few regions of amorphous phase when the thickness of the seed layer is large. Since resistivity of the amorphous phase is higher than the crystalline phase, the proportion of shunt of the sense current may be appropriately decrease to enable the rate of change of resistance to be improved.

The lower limit of the thickness of the seed layer is determined to be 15 Å because, when the thickness is smaller than 15 Å, the seed layer is so insufficiently grown that the layer has a sparse density without forming a uniform layer. Therefore, wettability and lubricity are not improved in addition to insufficient crystal orientation in the antiferromagnetic layer and ferromagnetic layer laminated on the seed layer. Furthermore, the rate of change of resistivity ($\Delta R/R$) and uniaxial exchange bias magnetic field (Hex*) are reduced as a result of decreasing the mean crystal grain diameter while deteriorating lubricity of the surface of each layer such as the antiferromagnetic layer on the seed layer, thereby arising an increased interlayer coupling magnetic field (Hin).

Accordingly, the seed layer was formed with a thickness in the range of 15 Å or more and 50 Å or less in the present invention.

More preferably, the seed layer is formed with a thickness of 15 Å or more and 40 Å or less in the present invention. The thickness of the seed layer was determined to be 40 Å or less in the present invention because a proper amount of the amorphous layer may be incorporated in the seed layer by restricting the thickness to be less than 40 Å. This enables the sense current to be appropriately prevented from shunting to the seed layer made of Cr, and the rate of change of resistance ($\Delta R/R$) to be properly improved. It was shown in the experiment to be described hereinafter that the rate of change of resistance can be reliably maintained at 10% or more.

It is more preferable in the present invention to form the seed layer with a thickness of 20 Å or more and 28 Å or less.

According to the experiment to be described hereinafter, it was confirmed that a rate of change of resistance ($\Delta R/R$) of 12% or more, a uniaxial exchange bias magnetic field (Hex*) of about $15.8 \times 10^4$ A/m, and an interlayer coupling magnetic field (Hin) of about zero A/m could be obtained by setting the thickness of the seed layer at 20 Å or more and 28 Å or less.

The seed layer can uniformly grow as a dense layer with improved wettability of the surface of the seed layer, when the thickness of the seed layer is adjusted to 20 Å or more and 28 Å or less. In addition, the seed layer mainly comprises the amorphous phase. Consequently, the degree of crystal orientation and mean crystal grain diameter of each layer formed on the seed layer may be increased to enable resistivity of the seed layer to be increased, because the seed layer mainly comprises the amorphous phase (or comprises only the amorphous phase). Therefore, the sense current may be suppressed from shunting to the seed layer to enable the rate of change of resistance ($\Delta R/R$) to be more improved while further increasing the unidirectional exchange bias magnetic field (Hex*). Since the seed layer 22 mainly comprises the amorphous layer, lubricity of the surface of each layer on the seed layer may be more properly improved to enable the interlayer coupling magnetic field (Hin) to come close to zero A/m.

In another preferable aspect of the present invention, an under layer comprising one or plural elements of Ta, Hf, Nb, Zr, Ti, Mo and W is not formed under the sheet layer, and the seed layer preferably has a thickness of 25 Å or more and 50 Å or less.

The upper limit of the thickness of the seed layer is restricted to be 50 Å in the present invention, because the proportion of shunt of the sense current to the seed layer 22 increases when the thickness of the seed layer is larger than 50 Å. The rate of change of resistance ($\Delta R/R$) is also largely decreased to make it impossible to obtain the same level of the rate of change of resistance as that in the related art. It also becomes difficult to allow the amorphous phase to be incorporated in the seed layer. The proportion of shunt of the sense current may be properly reduced and the rate of change of resistance may be improved by allowing the amorphous phase to contain in the seed layer, because the amorphous layer has higher resistivity than the crystalline phase.

The lower limit of the thickness of the seed layer was determined to be 25 Å because, when the thickness is smaller than 25 Å, the seed layer insufficiently grows with sparse density without growing with a uniform thickness. Consequently, wettability and lubricity are not improved, the degree of crystal orientation in the antiferromagnetic layer and ferromagnetic layer laminated on the seed layer becomes insufficient, and the mean crystal grain diameter decreases. This results in a small rate of change of resistance ($\Delta R/R$) and unidirectional exchange bis magnetic field (Hex*) with deteriorated lubricity of the surface of each layer such as the antiferromagnetic layer formed on the seed layer, thereby increasing the interlayer coupling magnetic field (Hin).

When the seed layer is formed without forming the underlayer in the present invention, it is preferable to set the thickness of the seed layer within the range of 25 Å or more and 50 Å or less.

It is more preferable in the present invention that the seed layer is formed with a thickness of 25 Å or more and 40 Å or less. The reason why the lower limit of the thickness of the seed layer was determined to be 25 Å is as described above.

The amorphous phase may be more properly incorporated in the seed layer, the proportion of shunt of the sense current to the seed layer made of Cr may be properly suppressed, and the rate of change of resistance ($\Delta R/R$) may be properly improved by forming the seed layer with a thickness of 40 Å or less. It was also found in the experiment to be described hereinafter that the rate of change of resistance of 10% or more may be maintained by forming the seed layer with a thickness of 40 Å or less.

It was confirmed that a uniaxial exchange bias magnetic field (Hex*) of about $11.85 \times 10^4$ A/m may be ensured by providing the seed layer with a thickness of 25 Å or more and 40 Å or less.

More preferably, the seed layer is formed with a thickness of 30 Å or more and 40 Å or less in the present invention.

According to the experiment to be described hereinafter, the rate of change of resistance ($\Delta R/R$) of 10% or more may be reliably obtained, the uniaxial exchange bias magnetic field (Hex*) may be increased to about $15.8 \times 10^4$ A/m, and the interlayer coupling magnetic field (Hin) may be suppressed to about 400 A/m or less by setting the thickness of the seed layer in the range of 30 Å or more and 40 Å or less.

The seed layer may be grown as a dense layer with a thickness while sufficiently improving wettability of the surface of the seed layer, by forming the seed layer with a thickness of 30 Å or more and 40 Å or less. The seed layer mainly comprises the amorphous phase. Consequently, the degree of crystal orientation and mean crystal grain diameter of each layer formed on the seed layer may be increased, and resistivity of the seed layer may be increased since the seed layer predominantly comprises the amorphous layer (or only comprises the amorphous layer). Therefore, the sense current may be suppressed from shunting to the seed layer to enable the rate of change of resistance ($\Delta R/R$) to be more improved while further increasing the unidirectional exchange bias magnetic field (Hex*). Since the seed layer mainly comprises the amorphous layer, lubricity of the surface of each layer on the seed layer 22 may be properly improved to enable the interlayer coupling magnetic field (Hin) to come close to zero A/m.

The seed layer may be in a mixed phase of the amorphous phase and crystalline phase, or the seed layer may comprise only the amorphous phase.

The crystal structure of the crystalline phase incorporated in the seed layer should be noticed herein. While the crystal structure was maintained as a face-centered cubic structure (fcc structure) by adjusting the composition ratio of the seed layer comprising the NiFeCr alloy, the crystal structure may be not always the face-centered cubic structure (fcc structure) in the present invention, and a body-centered cubic structure (bcc structure) may be accepted. According to the experimental results to be described hereinafter, the crystal structure of the crystalline phase incorporated in the seed layer made of Cr was the body-centered cubic structure (bcc structure).

The present invention was carried out by taking notice of further improvement of wettability of the surface of the seed layer, rather than the crystal structure of the seed layer that has been emphasized in the related art. Wettability of the surface of the seed layer may be remarkably improved over the related art by using the seed layer containing the amorphous phase according to the present invention. The unidirectional exchange bias magnetic field (Hex*) of the ferromagnetic layer as well as lubricity of the surface of each layer on the seed layer may be improved according to the present invention.

The ferromagnetic layer may comprise a specular reflection layer in the present invention. Since the surface of the ferromagnetic layer has good lubricity in the present invention, specular reflectivity of the specular reflection layer formed on the ferromagnetic layer may be improved with an improved rate of change of resistance ($\Delta R/R$) of the magnetic sensing element.

The mean crystal grain diameter of the crystal grains in the parallel direction to each layer formed on the seed layer is preferably 200 Å or more. The unidirectional exchange bias magnetic field (Hex*) is improved by forming such large crystal grains while making heat resistance and the rate of change of resistance ($\Delta R/R$) to be the same levels as or larger than those in the related art.

It is preferable in the present invention that the crystal grain boundary, formed in the antiferromagnetic layer exposed on the cross sectional surface after cutting the exchange coupling film in a direction parallel to the direction of thickness, is discontinuous to the crystal grain boundary formed in the ferromagnetic layer at least at a part of the interface between the antiferromagnetic layer and ferromagnetic layer.

It is also preferable in the present invention that the crystal grain boundary, formed in the antiferromagnetic layer exposed on the cross sectional surface after cutting the exchange coupling film in a direction parallel to the direction of thickness, is discontinuous to the crystal grain boundary formed in the seed layer at least at a part of the interface between the antiferromagnetic layer and seed layer.

The crystalline state described above means that the antiferromagnetic layer has properly transformed from a disordered lattice (face-centered cubic lattice) to an ordered lattice (face centered tetragonal lattice), enabling the exchange coupling magnetic field generated between the antiferromagnetic layer and ferromagnetic layer to be increased.

Twin crystals are formed at least at a part of the antiferromagnetic layer in the present invention, and twin crystal boundaries are preferably formed to be non-parallel to the interface of the seed layer in at least a part of the twin crystals.

The atoms in the antiferromagnetic layer are conjectured to not be restrained in the crystal structure immediately after film deposition in the present invention, when the twin crystal boundaries have appeared after deposition and heat treatment of the exchange coupling film. While the antiferromagnetic layer may be readily transformed from the disordered lattice (face-centered cubic lattice) to the ordered lattice (face-centered tetragonal lattice) by heat treatment when the restriction force at the boundary becomes insufficient, the crystal lattice cannot be effectively transformed unless lattice distortion caused by this phase transformation is properly relaxed. It may be conjectured that the atoms in the antiferromagnetic layer are rearranged from the disordered lattice to the ordered lattice by the phase transformation, and the lattice distortion caused thereby is relaxed by changing the atomic arrangement to be in a mirror symmetry state within a short distance. The boundaries formed by the mirror symmetry shift after the heat treatment serve as twin crystal boundaries, and forming these twin crystal boundaries means emergence of an ordered phase transformation by the heat treatment.

Since lattice distortion caused by rearrangement of the atoms in the direction parallel to the interface between the antiferromagnetic layer and ferromagnetic layer is relaxed in the vicinity of the interface, the twin crystal boundaries are formed in the direction to intersect the interface. Therefore, the twin crystal boundaries are formed to be non-parallel to the interface when the ordered transformation has properly occurred throughout the entire crystal. When the twin crystal boundaries are formed to be non-parallel to the interface as in the present invention, it is made possible to obtain a very large exchange coupling magnetic field.

Although discontinuity of the crystal grain boundaries and non-parallel twin crystal boundaries are caused by improvement of wettability of the surface of the seed layer, the composition ratio of the antiferromagnetic layer should be properly controlled in addition to the factors described above.

It is preferable in the present invention that the antiferromagnetic layer is formed of an antiferromagnetic material containing elements X (X represents one or plural elements of Pt, Pd, Ir, Rh, Ru and Os) and Mn.

Alternatively, the antiferromagnetic layer may be formed of a X—Mn—X' alloy (X' denotes one or plural elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements).

In the present invention, the X—Mn—X' alloy forms an invasion type solid solution comprising the element X' invaded in the interstices of the space lattice composed of the element X and Mn, or a substitution type solid solution in which a part of the lattice points composed of the element X and Mn are replaced with the element X'.

The composition ratio of the element X or elements X+X' are preferably 45 at % or more and 60 at % or less in the present invention.

The present invention also provides a magnetic sensing element comprising a seed layer, an antiferromagnetic layer, a pinned magnetic layer, a nonmagnetic layer and a free magnetic layer sequentially laminated from the bottom to the top, and the magnetization direction of the free magnetic layer is aligned in a direction intersecting the magnetization of the pinned magnetic layer. The seed layer, antiferromagnetic layer and pinned magnetic layer are formed of the exchange coupling film as hitherto described.

The present invention also provides a magnetic sensing element comprising a seed layer, an antiferromagnetic exchange bias layer, a free magnetic layer, a nonmagnetic layer, a pinned magnetic layer, and an antiferromagnetic layer sequentially laminated from the bottom to the top. The magnetization direction of the free magnetic layer is aligned in a direction intersecting the magnetization of the pinned magnetic layer, and the seed layer, exchange bias layer and free magnetic layer are formed of the exchange coupling film as hitherto described.

The present invention also provides a magnetic sensing element comprising a nonmagnetic layer laminated on and under the free magnetic layer, pinned magnetic layers formed on one of the nonmagnetic layer and under the other nonmagnetic layer, respectively, and antiferromagnetic layers formed on one of the pinned magnetic layer and under the other pinned layer, respectively, and a seed layer is formed under the antiferromagnetic layer formed below the free magnetic layer. Magnetization direction of the free magnetic layer is aligned in a direction intersecting the magnetization of the pinned magnetic layer and the seed layer. The antiferromagnetic layer and pinned magnetic layer bonded thereon are formed of the exchange coupling film as hitherto described.

The present invention also provides a magnetic sensing element comprising a seed layer, an antiferromagnetic exchange bias layer, a magnetoresistive layer, a nonmagnetic layer and a soft magnetic layer sequentially laminated from the bottom to the top. The seed layer, exchange bias layer and magnetoresistive layer are formed of the exchange coupling film as hitherto described.

Using the exchange coupling film for each magnetic sensing element permits wettability of the surface of the seed layer to be remarkably improved, and the crystal grain diameter in each layer formed on the seed layer to be larger than that obtained by using the NiFeCr alloy as the seed layer. Consequently, the unidirectional exchange bias magnetic field (Hex*) in the pinned magnetic layer may be increased while improving lubricity of the surface of each layer formed on the seed layer.

The present invention allows electric electromigration resistance to be improved even in high density recording while increasing the rate of change of resistance ($\Delta R/R$) to the same level as or more than the level attained in the related art. Heat resistance may remain to be the same or more of the heat resistance in the related art.

Reproductive characteristics may be also improved since the interlayer coupling magnetic field (Hin) due to static magnetic coupling (topological coupling) between the free magnetic layer and pinned magnetic layer is reduced while reducing asymmetry of the regenerative waveform, thereby improving regenerative characteristics.

It is preferable in the present invention that a specular reflection layer is further formed on the magnetic sensing element. Since lubricity of the surface of the specular reflection layer is also improved, the rate of change of resistance may be improved by the specular effect by improving specular reflectivity of the specular reflection layer.

DESCRIPTION OF THE PREFERRED EMBODIMENT

Figure 1:
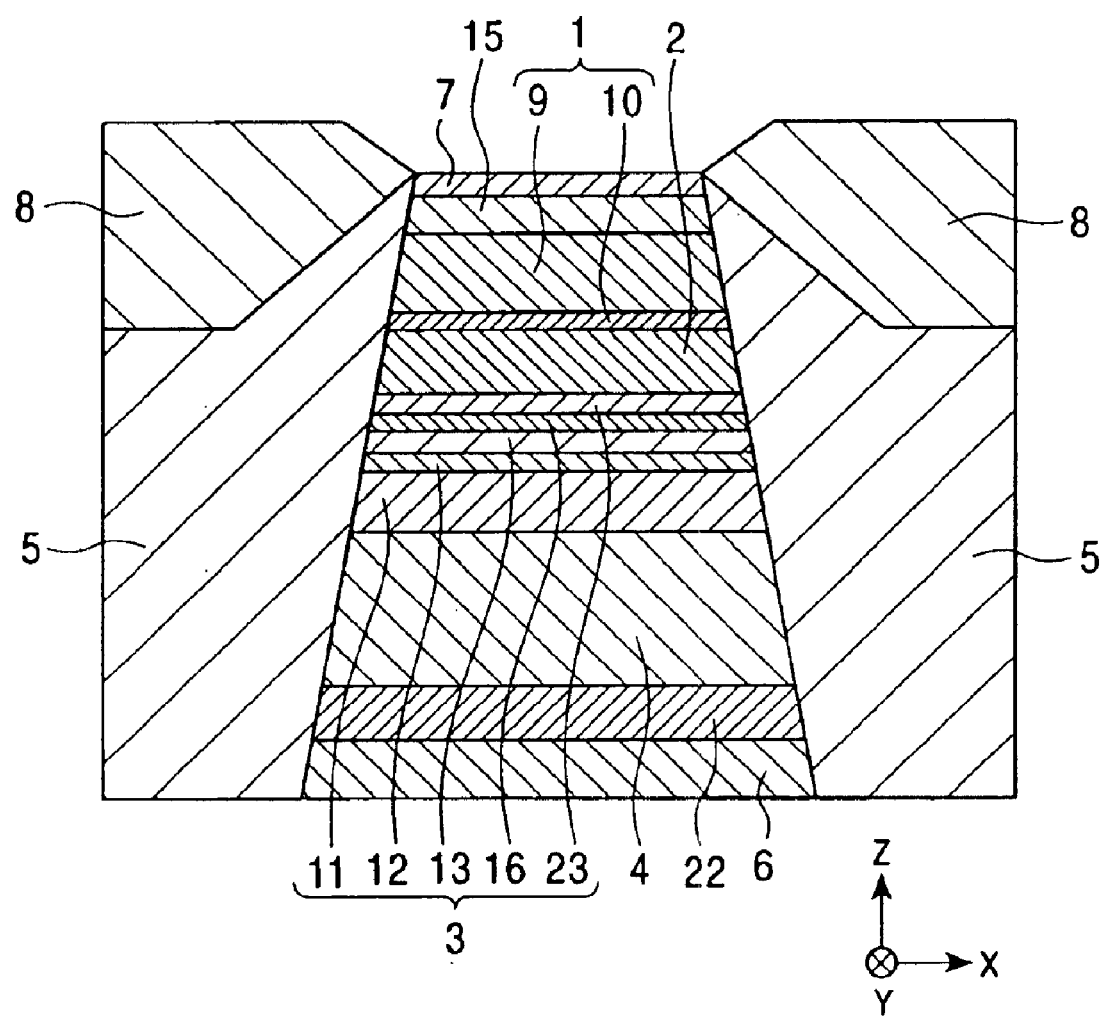
FIG. 1 is a cross section of the structure of the magnetic sensing element (single spin-valve type magnetoresistive element) in one embodiment of the present invention viewed from the opposed face side to the recording medium.

FIG. 1 is a cross section of the total structure of the magnetic sensing element (single spin-valve type magnetoresistive element) in one embodiment of the present invention viewed from the opposed face side to the recording medium. Only the central portion of the element elongating in the X-direction is cut in FIG. 1.

The recording magnetic field of a hard disk is sensed in this single spin-valve type magnetoresistive element by being provided at the end of a trailing side of a floating type slider provided in the hard disk device. The direction of travel of the magnetic recording medium such as the hard disk is the Z-direction, and a leak magnetic field from the magnetic recording medium is oriented in the Y-direction.

An underlayer 6 formed of a nonmagnetic material such as one or plural elements of Ta, Hf, Nb, Zr, Ti, Mo and W is formed at the lowermost layer in FIG. 1. A seed layer 22, an antiferromagnetic layer 4, a pinned magnetic layer 3, a nonmagnetic layer 2 and a free magnetic layer 1 are laminated on the underlayer 6.

The antiferromagnetic layer 4 formed on the seed layer 22 is preferably formed of an antiferromagnetic material containing an element X (X denotes one or plural elements of Pt, Pd, Ir, Rh, Ru and Os) and Mn.

A X—Mn alloy using these platinum group elements has excellent characteristics such as excellent corrosion resistance and high blocking temperature as well as an ability for making the exchange coupling magnetic field (Hex) large. Pt is preferably used among the platinum group elements particularly as a binary PtMn alloy.

The antiferromagnetic layer 4 may be formed of an antiferromagnetic element comprising the element X, an element X' (Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements) and Mn.

The preferably used element X' forms an solid solution in which X' invades in interstices of a space lattice composed of the element X and Mn, or replaces a part of lattice points of a crystal lattice composed of the element X and Mn. The term "solid solution" as used herein refers to as a solid in which components are uniformly mixed over a wide range.

Forming the invasion type or substitution type solid solution allows the lattice constant of the X—Mn—X' alloy to be larger than the lattice constant of the X—Mn alloy, thereby enabling the difference between the lattice constant of the antiferromagnetic layer 4 and the lattice constant of the pinned magnetic layer 3 to be larger, and the interface structure between the antiferromagnetic layer 4 and pinned magnetic layer 3 to be readily in a-non-coherent state. The non-coherent state as used herein refers to as a state in which the atoms constituting the antiferromagnetic layer 4 do not correspond to the atoms constituting the pinned magnetic layer 3 in a 1:1 relation at the interface between the antiferromagnetic layer 4 and pinned magnetic layer 3.

Antiferromagnetic characteristics decrease when the composition ratio of the element X' becomes too large to reduce the magnitude of the exchange coupling magnetic field generated at the interface of the pinned magnetic layer 3 by using the element X' that forms a substitution type solid solution. It is considered to be preferable particularly in the present invention to use a rare gas element (one or plural elements of Ne, Ar, Kr and Xe) as an inert gas that forms an invasion type solid solution as the element X'. Since the rare gas element is inert, antiferromagnetic properties are not so largely affected by allowing the rare gas element to be incorporated in the film. Moreover, since inert elements such as Ar are introduced into a sputtering apparatus as a sputtering gas, Ar may readily invade into the layer merely by properly adjusting the gas pressure.

While it is difficult to allow a large quantity of the element X' to be incorporated in the film when a gaseous element is used for the element X', the exchange coupling magnetic field may be largely increased by a heat treatment merely by allowing a minute amount of the gas to invade in the film.

The composition ratio of the preferable element X' is 0.2 to 10 at %, more preferably 0.5 to 5 at % in the present invention. Since the element X is preferably Pt in the present invention, the Pt—X—X' alloy is preferably used.

The content of the element X or elements X +X' in the antiferromagnetic layer 4 is preferably set in the range of 45 at % or more and 60 at % or less in the present invention. The proportion is more preferably 49 at % or more and 56.5 at % or less. The proportion above makes the interface at the pinned magnetic layer 3 to be in a non-coherent state, and the antiferromagnetic layer 4 is supposed to cause an appropriate transformation by the heat treatment.

The pinned magnetic layer 3 formed on the antiferromagnetic layer 4 comprises five layers.

The pinned magnetic layer 3 comprises five layers of a magnetic layer 11, an intermediate layer 12, a magnetic layer 13, a specular reflection layer 16 and a magnetic layer 23. The magnetization directions of the magnetic layers 11, 13 and 23 are put into an anti-parallel relation with each other by an exchange coupling magnetic field at the interface on the antiferromagnetic layer 4 and by an antiferromagnetic exchange coupling magnetic field (a RKKY mutual exchange action) through the intermediate layer 13. This magnetic state is referred to as an artificial ferrimagnetic coupling state, which stabilizes the magnetization of the magnetic layer 3 while apparently increasing the exchange coupling magnetic field at the interface between the pinned magnetic layer 3 and antiferromagnetic layer 4.

A specular reflection layer 16 is formed between the magnetic layers 13 and 23 in the present invention. Providing the specular reflection layer permits, for example, up-spin conduction electrons of conduction electrons that move in the magnetic layer by flowing a sense current to perform specular reflection at the boundary between the specular reflection layer 16 and magnetic layer 23 while maintaining their spin directions. Consequently, the mean free path of the up-spin electrons are expanded to make the difference of the mean free path lengths between the up-spin electrons and down-spin electrons large, thereby enabling the rate of change of resistance (ΔR/R) to be enhanced.

The surface of the magnetic layer 16 is oxidized after forming the magnetic layer 13, and the oxidized portion of the magnetic layer can function as the specular reflection layer 16. For example, the magnetic layer 13 is formed of a CoFe alloy, and the surface of the alloy is oxidized to form the specular layer 16 comprising a layer of Co—Fe—O on the surface of the magnetic layer 13. It is also preferable in the present invention to form the magnetic layers 11 and 23 with the CoFe alloy. Alternatively, the magnetic layers 11, 13 and 23 may be formed of a magnetic material such as a NiFe alloy or CoFeNi alloy, or Co.

In another aspect, the specular reflection layer 16 comprising a FeMO alloy (the element M denotes at least one of Mn, Co, Ni, Ba, Sr, Y, Cd, Cu and Zn) is deposited by sputtering on the magnetic layer 13, or is deposited without forming the magnetic layer 13, and the magnetic layer 23 is formed on the specular layer.

In any case, it is preferable in the present invention to form the pinned magnetic layer 3 together with the specular reflection layer.

The pinned magnetic layer 3 may contain no reflection layer. While the pinned magnetic layer 3 has a laminated ferrimagnetic structure in the embodiment shown in FIG. 1, this layer may comprise a monolayer of the magnetic material or a multilayer of the magnetic materials.

For example, the magnetic layer 11 is formed with a thickness of about 20 Å, the intermediate layer 12 is formed with a thickness of about 8 Å, and the magnetic layers 13 and 23 are formed with a thickness of about 5 to 15 Å.

The intermediate layer 12 is formed of a nonmagnetic conductive material such as Ru, Rh, Ir, Cr and Cu.

The nonmagnetic layer 2 formed on the pinned magnetic layer 3 is formed of, for example, Cu. When the magnetic sensing element according to the present invention is a tunnel effect type magnetoresistive element (TMR element), the nonmagnetic layer 2 is formed of, for example, an insulation material such as $Al_2O_3$.

The free magnetic layer 1 comprising two layers is formed on the nonmagnetic layer 2.

The free magnetic layer 1 is formed of, for example, two layers of a NiFe alloy film 9 and CoFe alloy film 10. The CoFe film 10 prevents diffusion of metal elements at the interface on the nonmagnetic layer 2 by forming it at the side making contact with the nonmagnetic layer 2, thereby allowing the rate of change of resistance (ΔR/R) to be increased.

The NiFe alloy film 9 is formed, for example, with a Ni content of 80 at % and Fe content of 20 at %. The CoFe alloy 10 contains, for example, 90 at % of Co and 10 at % of Fe. For example, the NiFe alloy film 9 is formed with a thickness of about 45 Å, and the CoFe alloy film is formed with a thickness of about 5 Å. Co or a CoFeNi alloy may be used in place of the CoFe alloy. The free magnetic layer 1 may be formed as a monolayer or a multilayer, preferably as a monolayer structure of the CoFeNi alloy. The free layer 1 may have the laminated ferrimagnetic structure as in the pinned magnetic layer 3.

A backed layer 15 comprising a metallic material or a nonmagnetic metal such as Cu, Au or Ag is formed on the free magnetic layer. The backed layer has a thickness of, for example, 20 Å or less.

A protective layer 7 is formed on the backed layer 15. The protective layer 7 is preferably a specular reflection layer comprising an oxide of Ta.

Forming the backed layer 15 permits the mean free path of the conduction electrons that contribute to the magnetoresistive effect to be expanded, enabling a large rate of change of resistance (ΔR/R) to be obtained in the spin-valve type magnetic element by a so-called spin filter effect, thereby enabling the element to comply with high density recording. The backed layer 15 may not be formed.

The mean free path of the conduction electrons can be expanded by allowing the up-spin conduction electrons to perform specular reflection at the specular reflection layer 7 by providing the specular reflection layer 7 on the backed layer 15, thereby enabling the rate of change of resistance (ΔR/R) to be more improved.

Oxides such as α—$Fe_2O_3$, Fe—O, Ni—O, Co—O, Co—Fe—O, Co—Fe—Ni—O, Al—O, Al—Q—O (Q denotes at least one element selected from B, Si, N, Ti, V, Cr, Mn, Fe, Co and Ni) and R—O (R denotes at least one element selected from Ti, V, Cr, Zr, Nb, Mo, Hf and W), nitrides such as Al—N, AlQ—N (Q denotes at least one element selected from B, Si, N, Ti, V, Cr, Mn, Fe, Co and Ni) and R—N (R denotes at least one element selected from Ti, V, Cr, Zr, Nb, Mo, Hf and W), and semi-metallic whistler metals such as NiMnSb and PtMnSb may be selected in addition to Ta oxide as the specular reflection layer 7. These materials may be also used for the specular layer 16 formed on the pinned magnetic layer 3.

A hard bias layer 5 and an electrode layer 8 are formed at each side of the laminated films from the underlayer 6 to the protective layer (specular reflection layer) 7 in the embodiment shown in FIG. 1. Magnetization of the free magnetic layer 1 is aligned in the track width direction (X-direction) by a longitudinal bias magnetic field from the hard bias layer 5.

The hard bias layers 5 are formed of, for example, a Co—Pt (cobalt-platinum) alloy or Co—Cr—Pt (cobaltchromium-platinum) alloy, and the electrode layers 8 are formed of α—Ta, Au, Cr, Cu, Rh, Ir, Ru and W. In the case of the tunnel effect type magnetoresistive element and CPP type magnetic sensing element, the electrode layers 8 are formed above the free magnetic layer 1 and below the antiferromagnetic layer 4, respectively.

A heat treatment is applied to the spin-valve type thin film element shown in FIG. 1 after laminating the layers from the underlayer 6 to the protective layer 7, thereby generating an exchange coupling magnetic field at the interface between the antiferromagnetic layer 4 and pinned magnetic layer 3. Magnetization of the pinned magnetic layer 3 is fixed in the direction perpendicular to the Y-direction in the drawing by aligning the magnetic field in the direction parallel to the Y-direction. Since the pinned magnetic layer 3 has a laminated ferrimagnetic structure in the embodiment shown in FIG. 1, the magnetic layers 13 and 23 are magnetized in the direction opposed to the Y-direction when the magnetic layer 11 is magnetized in the Y-direction.

The seed layer 22 is formed under the antiferromagnetic layer 4 in the embodiment shown in FIG. 1, and the seed layer 22 is formed of Cr in the present invention.

In addition, the seed layer 22 according to the present invention contains an amorphous phase in at least a part thereof. In other words, the seed layer 22 according to the present invention is not formed with a perfect crystalline phase.

Since the seed layer 22 is formed of Cr and contains the amorphous phase in at least a part thereof in the present invention, the surface energy of the seed layer is more enhanced to put the surface in an active state as compared with the seed layer comprising the NiFeCr alloy in the related art, or so-called wettability may be markedly improved in the present invention.

Improving wettability of the surface of the seed layer 22 makes the antiferromagnetic layer 4 formed on the seed layer 22 to be readily grown as a lamellar structure in addition to enabling the crystal grain diameter in each layer formed on the seed layer 22 to be larger than those in the related art.

Since wettability of the surface of the seed layer is markedly improved with the amorphous phase incorporated in at least a part of the seed layer, the seed layer itself may be properly lubricated.

The crystal grain in the seed layer 22 was large, and growth of steps at the grain boundaries was promoted as a result of a shadow effect exerted on sputtered particles during the growth process, making the surface of the antiferromagnetic layer 4 to be susceptible to undulations. However, because the deposited atoms can move relatively freely in the present invention even at the crystal grain boundaries formed in the antiferromagnetic layer 4 due to quite high wettability of the surface of the seed layer 22, and because the steps caused by the crystal grains are hardly formed due to the absence of the large crystal grains in the seed layer, it is possible to improve lubricity of the surface of the antiferromagnetic layer 4 over that in the related art.

The thickness of the seed layer 22 should be properly adjusted in order to allow at least a part of the seed layer 22 to incorporate the amorphous phase by forming the seed layer 22 with Cr as in the present invention.

The thickness of the seed layer 22 is determined to be 15 Å or more and 50 Å or less in the present invention as will be described hereinafter. Not only determination of the thickness of the layer, but also film deposition conditions for depositing the seed layer 22 are important factors for allowing the seed layer 22 to contain the amorphous phase.

For example, it is preferable in the present invention to adjust the temperature of the substrate for deposition of the seed layer by sputtering at 20 to 100° C., the distance between the substrate and target to 40 to 80 mm, and the pressure of the Ar gas introduced for deposition by sputtering to 0.5 to 3 mTorr (0.067 to 0.4 Pa). This allows the amorphous phase to be incorporated in the seed layer formed of Cr.

Wettability of the surface of the seed layer 22 may be markedly improved while improving lubricity of each layer on the seed layer 22 in the present invention, by forming the seed layer 22 with Cr and by allowing the amorphous phase to be incorporated in at least a part of the seed layer 22.

The unidirectional exchange bias magnetic field (Hex*) in the pinned magnetic layer 3 can be increased by improving wettability in the present invention. The unidirectional exchange bias magnetic field (Hex*) as used herein is defined as the magnitude of the external magnetic field (Hex*) at half of the maximum value of the rate of change of resistance (ΔR/R).

The unidirectional exchange bias magnetic field (Hex*) includes an exchange coupling magnetic field generated between the pinned magnetic layer 3 and antiferromagnetic layer 4, as well as a coupling magnetic field in the RKKY mutual exchange coupling generated between the CoFe alloy layers constituting the pinned magnetic layer 3, since the pinned magnetic layer 3 has a laminated ferrimagnetic structure.

When the pinned magnetic layer 3 is not in the laminated ferrimagnetic structure, the uniaxial exchange bias magnetic field (Hex*) mainly corresponds to an exchange coupling magnetic field generated between the pinned magnetic layer 3 and antiferromagnetic layer 4. When the pinned magnetic layer 3 has the laminated ferrimagnetic structure as shown in FIG. 1, on the other hand, the unidirectional exchange bias magnetic field (Hex*) means a combined magnetic field of the exchange coupling magnetic field and the coupling magnetic field in the RKKY mutual exchange coupling.

The larger is the unidirectional exchange bias magnetic field (Hex*), the pinned magnetic layer 3 may be more properly pinned in a given direction, magnetization of the pinned magnetic layer 3 may be kept in a given direction even in a high temperature environment without being defeated by the magnetic field induced by the electric current flowing in the element, or by the demagnetization magnetic field generated at the end of the minute element, and suppressing electromigration from generating, thereby enabling so-called electromigration resistance to be properly improved.

The unidirectional exchange bias magnetic field is considered to be increased by increasing the blocking temperature, as a result of enabling the crystal grain diameter in the direction parallel to the surface of each layer formed on the seed layer 22 to be large by virtue of very good wettability of the surface of the seed layer 22, and as a result of enabling the magnetic anisotropy $K_{AF}$ of the crystals in the antiferromagnetic layer 4 to be large.

Since the mean crystal grain diameter in the direction parallel to the surface of each layer can be increased in the present invention, grain boundary scattering of the conduction electrons is decreased to enable the rate of change of resistance (ΔR/R) to be the same level as or larger than that in the related art.

The interlayer coupling magnetic field (Hin) generated by a static magnetic coupling (topological coupling) between the pinned magnetic layer 3 and free magnetic layer 1 through the nonmagnetic layer 2 may be decreased in the present invention by improving lubricity of the surface of each layer formed on the seed layer 22, thereby enabling asymmetry of the regenerative waveform to be reduced and regenerative characteristics to be improved. The interlayer coupling magnetic field may be made to come close to zero A/m according to the experiments to be described hereinafter.

Providing the specular reflection layers 16 and 7 makes it possible to improve lubricity of each layer formed on the seed layer 22. Consequently, specular reflectivity of the specular reflection layers 17 and 7 may be improved by improving lubricity of the surface of the specular reflection layers 16 and 7 themselves, thereby enabling the rate of change of resistance ($\Delta R/R$) arising by providing the specular reflection layer to be properly improved.

It is preferable in the present invention to set the thickness of the seed layer 22 at 15 Å or more and 50 Å or less.

The range of the thickness of the layer is defined to be the thickness when the underlayer 6 is formed under the seed layer 22 as shown in FIG. 1.

Since the surface of the underlayer formed of Ta has relatively good wettability, the seed layer 22 comprising Cr may be more densely formed on the entire underlayer, and wettability of the surface of the seed layer 22 may be properly improved.

Furthermore, it was confirmed by the experiments to be described hereinafter that the permissible range of the thickness of the seed layer for obtaining a given magnitude of the unidirectional exchange bias magnetic field (Hex*) and the change of resistivity of resistance ($\Delta R/R$) may be expanded by providing the underlayer 6 as compared with the case having no underlayer 6.

The upper limit of the thickness of the seed layer 22 was determined to be 50 Å in the present invention, because the proportion of shunt of the sense current to the seed layer 22 increases by increasing the thickness of the seed layer 22, thereby largely reducing the rate of change of resistivity ($\Delta R/R$) to make it impossible to obtain at least the same level of the rate of change of resistivity as that in the related art. The amorphous phase is also difficult to be incorporated in the seed layer 22 when the thickness is increased. The proportion of shunt of the sense current may be properly decreased by allowing the seed layer 22 to contain the amorphous phase, because the amorphous phase has a higher resistivity than the crystalline phase, thereby permitting the rate of change of resistance to be improved.

The lower limit of the thickness of the seed layer 22 was determined to be 15 Å because, when the thickness is smaller than 15 Å, wettability and lubricity of the seed layer 22 cannot be improved due to insufficient growth of the seed layer 22 with spare density of the layer to inhibit growth of the layer with uniform thickness. Consequently, crystal orientation of the antiferromagnetic layer 4 laminated on the seed layer 22, and crystal orientation of each layer formed on the antiferromagnetic layer becomes insufficient with a small mean crystal grain diameter, thereby reducing the rate of change of resistance ($\Delta R/R$) and unidirectional exchange bias magnetic field (Hex*).

The surface tends to be rough when the thickness of the seed layer 22 is 15 Å or less because the seed layer 22 cannot be uniformly grow, thereby increasing the interlayer coupling magnetic field (Hin) to increase asymmetry of the regenerative output.

The seed layer 22 is formed with a thickness in the range of 15 Å or more and 50 Å or less in the present invention based on the descriptions above.

Preferably, the seed layer 22 is formed with a thickness in the range of 15 Å or more and 40 Å or less in the present invention. The reason why the lower limit of the thickness of the seed layer 22 is determined to be 15 Å is as hitherto described. The thickness of the seed layer was determined to be 40 Å or less because the seed layer 22 is allowed to properly contain the amorphous phase at the thickness of 40 Å or less, thereby enabling the sense current to be properly suppressed from shunting to the seed layer 22 formed of Cr, and the rate of change of resistance ($\Delta R/R$) to be properly improved. The experiments to be described hereinafter revealed that a rate of change of resistance of 10% or more can be reliably obtained.

More preferably, the seed layer 22 is formed with a thickness within the range of 20 Å or more and 28 Å or less in the present invention.

According to the experiments to be described hereinafter, setting the thickness of the seed layer 22 in the range of 20 Å or more and 28 Å or less permits the rate of change of resistance ($\Delta R/R$) to be 12% or more, the unidirectional exchange bias magnetic field (Hex*) to be about $15.8 \times 10^4$ A/m, and the interlayer coupling magnetic field (Hin) to be about zero A/m.

The seed layer 22 is uniformly grown with a dense thickness, wettability of the seed layer 22 can be sufficiently improved, and the seed layer 22 can be mainly composed of the amorphous layer when the thickness of the seed layer 22 is 20 Å or more and 28 Å or less. This enables crystal orientation to be improved and the mean crystal grain diameter to be increased in each layer formed on the seed layer 22 while increasing resistivity due to a large content of the amorphous phase (or complete amorphous phase) in the seed layer 22. Consequently, the sense current is suppressed from shunting to the seed layer 22, the rate of change of resistance ($\Delta R/R$) is further improved, and the unidirectional exchange bias magnetic field (Hex*) is further increased. Since the seed layer 22 is made to be mainly composed of the amorphous phase, lubricity of each layer formed on the seed layer 22 can be more properly improved while allowing the interlayer coupling magnetic field (Hin) to come more properly close to zero A/m.

It is preferable to form the seed layer 22 with a thickness of 25 Å or less and 50 Å or less when no underlayer 6 is provided.

The upper limit of the seed layer 22 was determined to be 50 Å because the proportion of shunt of the sense current to the seed layer 22 increases, the rate of change of resistance ($\Delta R/R$) largely decreases, and the same level of the rate of change of resistance as that in the related art cannot be obtained by increasing the thickness of the seed, layer 22 when the thickness of the seed layer 22 is large. The amorphous phase also becomes difficult to be incorporated in the seed layer 22. The proportion of shunt of the sense current is properly decreased by allowing the amorphous phase to be incorporated in the seed layer 22, because the amorphous phase has higher resistivity than the crystalline phase, thereby enabling the rate of change of resistance to be improved.

The lower limit of the thickness of the seed layer 22 was determined to be 25 Å because, when the thickness is smaller than 25 Å, the seed layer is insufficiently grown with a sparse density without growing with a uniform thickness, wettability of the seed layer 22 is not improved, crystal orientation of the antiferromagnetic layer 4 laminated on the seed layer, crystal orientation of each layer formed on the antiferromagnetic layer becomes insufficient, and the mean crystal grain diameter decreases. Consequently, the rate of change of resistance (ΔR/R) as well as the unidirectional exchange bias magnetic field (Hex*) are reduced to deteriorate lubricity of the surface of the antiferromagnetic layer 4 formed on the seed layer 22 to increase the interlayer coupling magnetic field (Hin).

Accordingly, the thickness of the seed layer 22 is determined in the range of 25 Å or more and 50 Å or less in the present invention when no underlayer 6 is provided under the seed layer 22.

The seed layer 22 is preferably formed with a thickness of 25 Å or more and 40 Å or less when no underlayer 6 is provided as described above. The reason why the lower limit of the thickness of the seed layer 22 is determined to be 25 Å is as hither to described.

The amorphous phase may be more properly incorporated in the seed layer while preventing the sense current from shunting to the seed layer 22 formed of Cr by adjusting the thickness of the seed layer 22 to be 40 Å or less, thereby enabling the rate of change of resistance to be improved. It was confirmed by the experiments to be described hereinafter that a rate of change of resistance (ΔR/R) of 10% or more is secured.

A unidirectional exchange bias magnetic filed (Hex*) of about $11.85 \times 10^4$ A/m is also properly obtained by setting the thickness of the seed layer 22 in the range of 25 Å or more and 40 Å or less.

It is preferable in the present invention that the seed layer 22 is formed with a thickness of 30 Å or more and 40 Å or less.

According to the experiments to be described hereinafter, forming the seed layer 22 with a thickness of 30 Å or more and 40 Å or less enables the rate of change of resistance (ΔR/R) to be reliably 10% or more and the uniaxial exchange bias magnetic field (Hex*) to be about $15.8 \times 10^4$ A/m, while suppressing the interlayer coupling magnetic field to 400 A/m or less.

When the thickness of the seed layer 22 is 30 Å or more and 40 Å or less, the seed layer 22 is grown with a uniform thickness while sufficiently improving wettability of the seed layer 22, and the seed layer 22 is able to be mainly composed of the amorphous phase. Consequently, the mean crystal grain diameter in each layer formed on the seed layer 22 increases with good orientation of the crystal grains. Since the seed layer 22 contains a large proportion of the amorphous phase (or entirely composed of the amorphous phase), the sense current is suppressed from shunting to the seed layer 22 to further improve the rate of change of resistance (ΔR/R) as a result of increasing resistivity. The unidirectional exchange bias magnetic field (Hex*) is also largely increased. Since the seed layer 22 is composed of a proper proportion of the amorphous phase, lubricity of the surface of each layer formed on the seed layer 22 is properly improved to enable the interlayer coupling magnetic field (Hin) to come close to zero A/m.

The structure of the seed layer 22 will be described hereinafter. As hitherto described, while at least a part of the seed layer contains an amorphous phase, the seed layer 22 may be a mixed phase comprising the amorphous phase and crystalline phase, or may comprise only the amorphous phase.

The crystalline phase may have any crystal structures when the seed layer 22 contains the crystalline phase. The experiments to be described hereinafter revealed that the crystalline phase has a body-centered cubic structure (bcc structure). However, each layer formed on the seed layer 22 is more properly grown as lamellar layers with a large crystal grain diameter, and the unidirectional exchange bias magnetic field (Hex*) increases while properly improving lubricity of the surface of each layer owing to quite high wettability of the surface of the seed layer 22 in the present invention, irrespective of the crystal structure of the crystalline phase.

The mean crystal grain diameter of the crystal grains, formed in each layer formed on the seed layer 22, in the direction parallel to the surface of each layer is preferably 200 Å or more in the present invention. According to the experiments to be described hereinafter, the mean crystal grain diameter is confirmed to be 200 Å or more in the examples in which the seed layer 22 is formed of Cr.

Forming the layer with the crystal grain size of 200 Å or more enables electromigration resistance to be improved to improve electromigration resistance, thereby enabling the rate of change of resistance (ΔR/R) and heat resistance to be the same as or more than those in the related art.

It is preferable in the present invention that the crystal grain boundaries of the antiferromagnetic layer 4, exposed by cutting the magnetic sensing element in the direction parallel to the direction of thickness, is discontinuous to the crystal grain boundaries of the pinned magnetic layer 3 at least at a part of the interface between the antiferromagnetic layer 4 and pinned magnetic layer 3.

It is also preferable in the present invention that the crystal grain boundaries in the antiferromagnetic layer 4, exposed by cutting the magnetic sensing element in the direction parallel to the direction of thickness, is discontinuous to the crystal grain boundaries of the seed layer 22 at least at a part of the interface between the antiferromagnetic layer 4 and seed layer 22.

Twin crystals are formed in at least a part of the antiferromagnetic layer 4, and at least a part of the twin crystals are preferably formed to have twin crystal boundaries to be non-parallel to the interface on the seed layer 22.

A so-called non-coherent state is maintained at the interface between the antiferromagnetic layer 4 and pinned magnetic layer 3 when the crystalline state is in the relation as described above. Since the antiferromagnetic layer performs an appropriate modification from a disordered lattice to a ordered lattice, a large exchange coupling magnetic field may be obtained.

For attaining the relation described above, it is necessary to properly control the composition ratio of the antiferromagnetic layer 4 as well as the film deposition conditions for forming each layer on the seed layer 22, besides the surface of the seed layer 22 has high wettability.

As hitherto described, the composition ratio of the element X or the elements X+X' constituting the antiferromagnetic layer 4 is preferably 45 at % or more and 60 at % or less.

The pressure of the Ar gas to be used for film deposition by sputtering is adjusted to 3 mTorr as one of the film deposition conditions. The heat treatment temperature in a magnetic field for generating an exchange coupling magnetic field between the antiferromagnetic layer 4 and pinned magnetic layer 3 is adjusted to 300° C. or more and 300° C. or less with a heat treatment time of 2 hours or more in a vacuum of $10^{-6}$ Torr or less. The distance between the substrate and target is set to 80 mm.

The interfaces between the antiferromagnetic layer 4 and pinned magnetic layer 3, and between the antiferromagnetic layer 4 and seed layer 22 may be put in a non-coherent state by controlling the composition ratio and deposition condition of the antiferromagnetic layer 4, thereby enabling an exchange coupling magnetic field as high as $11.58 \times 10^4$ A/m or more between the antiferromagnetic layer 4 and pinned magnetic layer 3 to be obtained.

Crystal orientation in each layer formed on the seed layer 22 is not necessarily in the [111] direction that is a direction parallel to the surface of each layer on the seed layer 22 in the present invention, and [111] orientation may be insufficient.

While it is preferable in the present invention that crystal orientation in each layer on the seed layer 22 is preferably in the [111] direction, wettability of the surface of the seed layer 22 rather than crystal orientation in each layer is emphasized in the present invention. In addition, the uniaxial exchange bias magnetic field (Hex*) in the pinned magnetic layer 3 is made to be larger than that in the related art while enabling lubricity of the surface of each layer on the seed layer 22 to be improved, by allowing the amorphous phase to be contained in at least a part of the seed layer 22.

Figure 2:
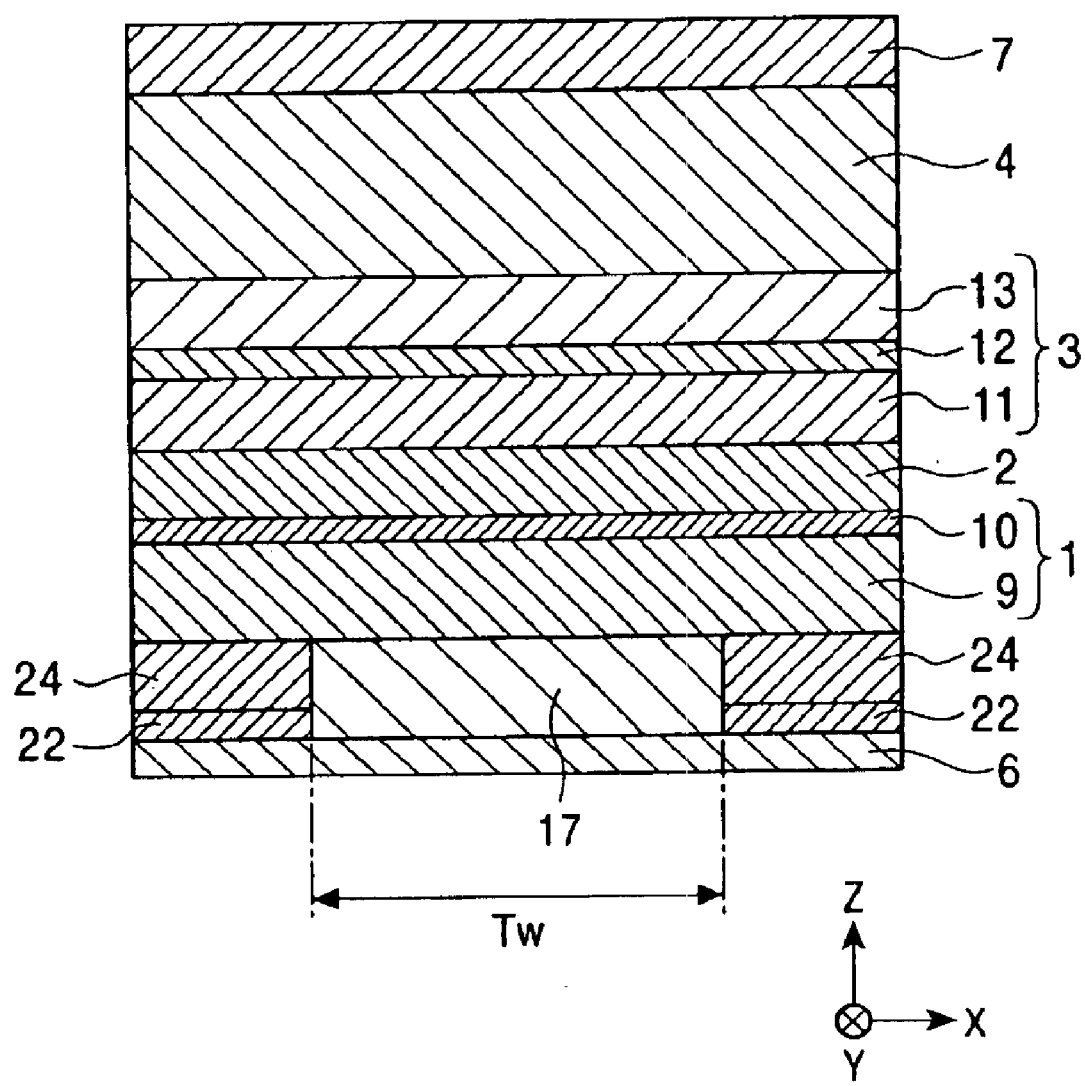
FIG. 2 is a cross section of the structure of the magnetic sensing element (single spin-valve type magnetoresistive element) in another embodiment of the present invention viewed from the opposed face side to the recording medium.

FIG. 2 and drawings thereafter denote magnetic sensing elements having different layer structures from the magnetic sensing element shown in FIG. 1.

FIG. 2 shows a partial cross section of the structure of another magnetic sensing element (a spin-valve type thin film element) according to the present invention viewed from an opposed face side to the recording medium.

A pair of seed layers 22 are formed on an underlayer 6 with a space corresponding to a track width Tw in the direction of the track width (X-direction) in the spin-valve type thin film element shown in FIG. 2, and an exchange bias layer 24 is formed on each seed layer 22.

The spaces between a pair of the seed layers 22 and exchange bias layers 24 are filled with an insulation material such as $SiO_2$ and $Al_2O_3$.

A free magnetic layer 1 is formed on the exchange bias layers 24 and insulation layer 17.

The exchange bias layer 24 is formed of a X—Mn alloy or X—Mn—$X^1$ alloy. The composition ratio of the element X or elements X+X' is preferably 45 at % or more and 60 at % or less, more preferably 49 at % or more and 56.5 at % or less.

The free magnetic layer 1 is magnetized as single magnetic domains at both ends by an exchange coupling magnetic field between the exchange bias layers 24, and magnetization of the free magnetic layer 1 in the track width Tw region is appropriately aligned in the X-direction to an extent capable of responding to an external magnetic field.

As shown in FIG. 2, a nonmagnetic layer 2 is formed on the free magnetic layer 1, and a pinned magnetic layer 3 is formed on the nonmagnetic layer 2. An antiferromagnetic layer 4 and a protective layer 7 are additionally formed on the pinned magnetic layer 3.

The seed layer 22 is formed of Cr in this embodiment, and contains an amorphous phase in at least a part thereof.

Wettability of the surface of the seed layer 22 is markedly enhanced as compared with that in the related art by forming the seed layer 22 using Cr containing the amorphous phase while making the crystal grain diameter in each layer on the seed layer 22 large, thereby increasing the unidirectional exchange bias magnetic field (Hex*) in the free magnetic layer 1 while improving lubricity of the surface of each layer formed on the seed layer 22. A rate of change of resistance ($\Delta R/R$) with the same level as or larger than the level in the related art may be also obtained.

Accordingly, electron migration resistance represented by electromigration resistance may be also improved according to the present invention while reducing an interlayer coupling magnetic field (Hin) caused by static magnetic coupling (topological coupling) between the free magnetic layer 1 and pinned magnetic layer 3. Asymmetry of the regenerative waveform may be also reduced. When a secular reflection layer is provided, the rate of change of resistance ($\Delta R/R$) may be improved by improving specular reflectivity of the specular reflection layer.

It is preferable in the present invention to form the seed layer 22 with a thickness within the range of 15 Å or more and 50 Å or less.

The range of the thickness corresponds to the thickness including the underlayer 6 provided under the seed layer 22.

The upper limit of the seed layer 22 was determined to be 50 Å because the proportion of shunt of a sense current to the seed layer 22 increases to largely reduce the rate of change of resistance ($\Delta R/R$) by increasing the thickness of the seed layer 22, which makes it impossible to obtain the same level of the rate of change of resistance as in the related art. The seed layer 22 becomes difficult to incorporate the amorphous phase when the thickness thereof is increased. Allowing the seed layer 22 to incorporate the amorphous phase enables the proportion of shunt of the sense current to be properly decreased to improve the rate of change of resistance, because the amorphous phase has higher resistivity than the crystalline phase.

The lower limit of the seed layer 22 was determined to be 15 Å because, when the thickness is smaller than 15 Å, the seed layer is insufficiently grown with a sparse density to unable the layer to grow with a uniform thickness. Consequently, wettability and lubricity cannot be improved and crystal orientation in each layer laminated on the seed layer 22 becomes insufficient with a small crystal grain diameter, thereby reducing the rate of change of resistance ($\Delta R/R$) and unidirectional exchange bias magnetic field (Hex*).

A thickness of the seed layer 22 of 15 Å or less makes it impossible for the seed layer 22 to uniformly grow and tends to generate a rough surface, which increases the interlayer coupling magnetic field (Hin) to increase asymmetry of the regenerative output.

The seed layer 22 was formed with a thickness in the range of 15 Å or more and 50 Å or less in the present invention for the reasons as described above.

It is preferable in the present invention to form the seed layer 22 with a thickness of 15 Å or more and 40 Å or less The reason why the lower limit of the seed layer 22 is determined to be 15 Å is as hitherto described. The thickness of the seed layer 22 was determined to be 40 Å or less in the present invention because the amorphous phase may be more properly incorporated in the seed layer 22 by adjusting the thickness to 40 Å or less. Consequently, the sense current is properly suppressed from shunting to the seed layer 22 while improving the rate of change of resistance ($\Delta R/R$) in an appropriate range. It was shown from the experiments to be described hereinafter that a rate of change of resistance of 105 or more may be reliably obtained.

It is further preferable in the present invention to form the seed layer 22 with a thickness of 20 Å or more and 28 Å or less.

According to the experiments to be described hereinafter, the rate of change of resistance ($\Delta R/R$) is made to be 12% or more and the unidirectional exchange bias magnetic field (Hex*) is increased to about $15.8 \times 10^4$ A/m while allowing the interlayer coupling magnetic field (Hin) to come close to about zero A/m by setting the thickness of the seed layer 22 to 20 Å or more and 28 Å or less.

Forming the seed layer 22 with a thickness of 20 Å or more and 28 Å or less allows the seed layer 22 to grow with as a dense layer with a uniform thickness and wettability of the surface of the seed layer 22 to be sufficiently improved while making the amorphous phase to be a principal constituent of the seed layer 22. Consequently, crystal orientation is improved and the crystal grain size is increased in each layer formed on the seed layer 22. Since resistivity of the seed layer 22 increases by allowing a large proportion of the amorphous layer to contain (or by forming all the seed layer with the amorphous phase), the rate of change of resistance (ΔR/R) is further improved by suppressing the sense current from shunting to the seed layer 22, thereby enabling the unidirectional exchange bias magnetic field (Hex*) to be further increased. Since the seed layer 22 mainly comprises the amorphous phase, lubricity of the surface of each layer on the seed layer 22 may be more properly improved to enable the interlayer coupling magnetic field (Hin) to come close to zero A/m.

The seed layer 22 is preferably formed with a thickness of 25 Å or more and 50 Å or less when no underlayer 6 is provided.

The upper limit of the thickness of the seed layer 22 was determined to be 50 Å because the proportion of shunt of the sense current to the seed layer 22 increases to largely decrease the rate of change of resistance (ΔR/R) by increasing the thickness of the seed layer 22, thereby making it impossible to obtain the same level of the rate of change of resistance as that in the related art. The seed layer 22 also becomes difficult to incorporate the amorphous phase when the thickness increases. The amorphous phase incorporated in the seed layer 22 permits the proportion of shunt of the sense current to be properly decreased since the amorphous phase has higher resistivity than the crystalline phase, or the rate of change of resistance to be improved.

The lower limit of the thickness of the seed layer 22 was determined to be 25 Å because, when the thickness is smaller than 25 Å, the seed layer 22 insufficiently grows with sparse density and uneven thickness to fail in improving wettability and lubricity of the seed layer 22. Moreover, crystal orientation in the exchange bias layer 24 laminated on the seed layer and crystal orientation in each layer formed on the exchange bias layer becomes insufficient with a small mean crystal grain diameter. Consequently, the rate of change of resistance (ΔR/R) as well as the unidirectional exchange bias magnetic field (Hex*) are reduced, and lubricity on the surface of the exchange bias layer 24 on the seed layer 22 is deteriorated with an increased interlayer coupling magnetic field (Hin).

Accordingly, the preferable thickness of the seed layer 22 was determined in the range of 25 Å or more and 50 Å or less in the present invention when no underlayer 6 is provided under the seed layer 22.

It is more preferable to form the seed layer with a thickness of 25 Å or more and 40 Å or less when no underlayer 6 is provided. The reason why the lower limit of the thickness of the seed layer is determined to be 25 Å is as hitherto described.

The seed layer 22 is allowed to more properly contain the amorphous phase to properly suppress the sense current from shunting to the seed layer 22 made of Cr by setting the thickness of the seed layer 22 to 40 Å or less, thereby enabling the rate of change of resistance (ΔR/R) to be properly improved. The experiments to be described hereinafter revealed that a rate of change of resistance of 10% or more can be obtained.

Determining the thickness of the seed layer 22 in the range of 25 Å or more and 40 Å or less permits the unidirectional exchange coupling bias magnetic field (Hex*) to be maintained at about $11.85 \times 10^4$ A/m or more.

It is more preferable in the present invention to form the seed layer 22 with a thickness of 30 Å or more and 40 Å or less.

According to the experiments to be described hereinafter, it was shown that a rate of change of resistance (ΔR/R) of 10% or more is reliably obtained while ensuring a unidirectional exchange coupling bias magnetic field (Hex*) of about $15.8 \times 10^4$ A/m by restricting the thickness of the seed layer 22 within the range of 30 Å or more and 40 Å or less. The interlayer coupling magnetic field (Hin) may be also suppressed below 400 A/m.

Setting the thickness of the seed layer 22 to 30 Å or more and 40 Å or less permits the seed layer 22 to be uniformly and densely grown, and wettability of the surface of the seed layer 22 to be sufficiently improved while mainly constituting the seed layer 22 with the amorphous phase. This allows the mean crystal grain diameter of each layer formed on the seed layer 22 to be large, and the sense current to be suppressed from shunting to the seed layer 22 as a result of increasing resistivity of the seed layer 22 containing a large proportion of the amorphous layer (or entirely comprising the amorphous layer). Consequently, the rate of change of resistance (ΔR/R) is further improved, and the unidirectional exchange bias magnetic field (Hex*) is further increased. Lubricity of the surface of each layer on the seed layer 22 may be more properly improved by forming the seed layer 22 mainly comprising the amorphous layer, thereby enabling the interlayer coupling magnetic field (Hin) to come close to zero A/m.

Figure 3:
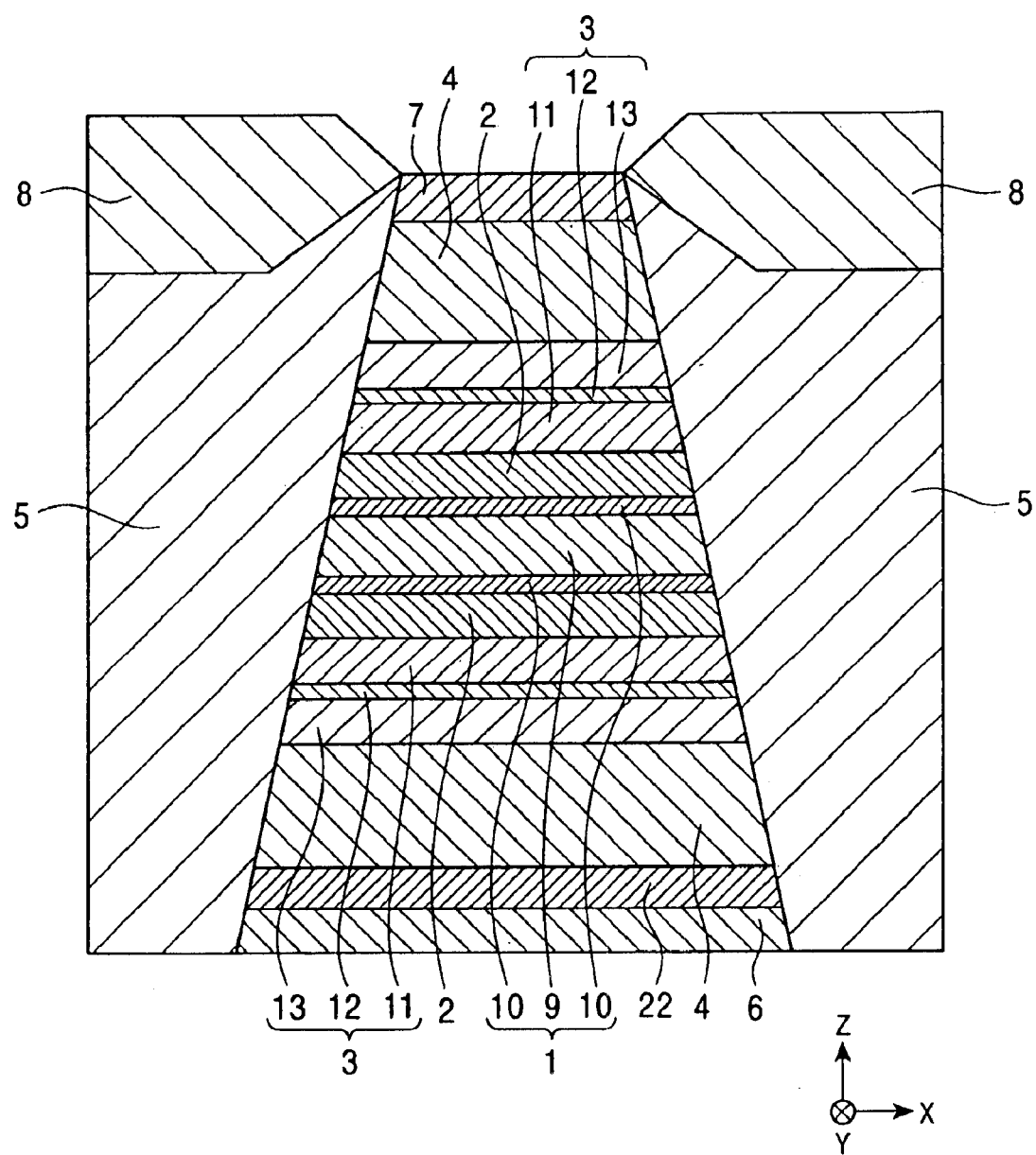
FIG. 3 is a cross section of the structure of the magnetic sensing element (dual spin-valve type magnetoresistive element) in a different embodiment of the present invention viewed from the opposed face side to the recording medium.

FIG. 3 is a partial cross section showing the structure of a dual spin-valve type thin film element according to the present invention.

As shown in FIG. 3, an underlayer 6, a seed layer 22, an antiferromagnetic layer 4, a pinned magnetic layer 3, a nonmagnetic layer 2 and a free magnetic layer 1 are continuously laminated from the bottom. The free magnetic layer 1 is formed into three layers comprising, for example, Co films 10 and a NiFe alloy film 9. In addition, a nonmagnetic layer 2, a pinned magnetic layer 3, an antiferromagnetic layer 4 and a protective layer 7 are continuously laminated on the free magnetic layer 1.

Hard bias layers 5 and electrode layers 8 are laminated at both sides of the multilayer from the underlayer 6 to the protective layer 7. Each layer is formed of the same materials as described in FIG. 1.

A seed layer 22 is formed under the antiferromagnetic layer 4 located below the free magnetic layer 1 in this example as shown in the drawing. The composition ratio of the element X or the element X+X' constituting the antiferromagnetic layer 4 is preferably 45 at % or more and 60 at % or less, more preferably 49 at % or more and 56.5 at % or less.

The seed layer 22 also formed of Cr in this embodiment, and at least a part of it comprised an amorphous phase.

Wettability of the surface of the seed layer 22 may be enhanced and the crystal grain diameter in each layer on the seed layer 22 may be increased as compared with those in the related art by forming the seed layer 22 with Cr containing the amorphous layer, thereby enabling the uniaxial exchange bias magnetic field (Hex*) to be increased while improving lubricity of each layer formed on the seed layer 22. The rate of change of resistance (ΔR/R) may be also increased to the same or larger level as in the related art.

Accordingly, electromigration resistance represented by electromigration resistance may be improved in the present invention. Since the interlayer coupling magnetic field (Hin) due to static magnetic coupling (topological coupling) between the free magnetic layer 1 and pinned magnetic layer 3 is reduced, asymmetry of the regenerative waveform of the magnetic head is also reduced. Specular reflectivity of the specular reflection layer is improved when the specular reflection layer is provided, thereby enabling the rate of change of resistance to be improved.

Accordingly, it is possible in the present invention that can manifest the effects as hitherto described to manufacture a spin-valve type thin film element that can well comply with high density recording in the future, even when the sense current density flowing in the magnetic recording element is increased.

It is preferable in the present invention to form the seed layer 22 with a thickness of 15 Å or more and 50 Å or less.

As shown in FIG. 3, the range of thickness corresponds to the thickness including the underlayer 6 formed under the seed layer 22.

The upper limit of the thickness of the seed layer 22 was determined to be 50 Å because the proportion of shunt of the sense current to the seed layer 22 increases to largely decrease the rate of change of resistance (ΔR/R) by increasing the thickness of the seed layer 22, thereby making it impossible to obtain the same level of the rate of change of resistance as that in the related art. In the seed layer 22, it also becomes difficult to incorporate the amorphous phase when the thickness increases. The amorphous phase incorporated in the seed layer 22 permits the proportion of shunt of the sense current to be properly decreased since the amorphous phase has higher resistivity than the crystalline phase, or the rate of change of resistance to be improved.

The lower limit of the thickness of the seed layer 22 was determined to be 15 Å because, when the thickness is smaller than 15 Å, the seed layer 22 insufficiently grows with sparse density and uneven thickness to fail in improving wettability and lubricity of the seed layer 22. Moreover, crystal orientation in the antiferromagnetic layer 4 laminated on the seed layer 22 and crystal orientation in each layer formed on the antiferromagnetic layer become insufficient with a small mean crystal grain diameter. Consequently, the rate of change of resistance (ΔR/R) as well as the unidirectional exchange bias magnetic field (Hex*) are reduced.

A rough surface tends to appear when the thickness of the seed layer 22 is less than 15 Å because the seed layer is not uniformly grown, thereby increasing the interlayer coupling magnetic field (Hin) to increase asymmetry of the regenerative output.

Accordingly, The seed layer 22 was formed in the present invention with a thickness of 15 Å or more and 50 Å or less.

It is more preferable in the present invention to form the seed layer 22 with a thickness of 15 Å or more and 40 Å or less. The reason why the lower limit of the seed layer 22 was determined to be 15 Å is as hitherto described. The thickness of the seed layer 22 was determined to be 40 Å or less in the present invention because the amorphous layer may be properly incorporated in the seed layer 22 and the sense current may be suppressed from shunting to the seed layer 22 formed of Cr by forming the seed layer with a thickness of 40 Å or less, thereby enabling the rate of change of resistance (ΔR/R) to be properly improved. According to the experiments to be described hereinafter, it was shown that a rate of change of resistance of 10% or more could be reliably maintained.

It is more preferable in the present invention to form the seed layer 22 with a thickness of 20 Å or more and 28 Å or less.

According to the experiments to be described hereinafter, it was shown that the rate of change of resistance (ΔR/R) is made to be 12% or more, the unidirectional exchange bias magnetic field is increased to about $15.8 \times 10^4$ A/m or more, and the interlayer coupling magnetic field (Hin) is decreased to about zero A/m by setting the thickness of the seed layer 22 in the range of 20 Å or more and 28 Å or less.

Forming the seed layer 22 with a thickness of 20 Å or more and 28 Å or less enables a dense and uniform seed layer 22 to be grown, and wettability of the surface of the seed layer 22 to be sufficiently improved by forming the seed layer 22 mainly comprising the amorphous phase. Consequently, the mean crystal grain diameter in each layer formed on the seed layer 22 as well as resistivity of the seed layer 22 may be increased since the seed layer 22 contains a large proportion of the amorphous phase (or the seed layer is completely formed of the amorphous phase). As a result, the sense current is suppressed from shunting to the seed layer 22 to further improve the rate of change of resistance (ΔR/R) while further increasing the unidirectional exchange bias magnetic field (Hex*). Since the seed layer 22 mainly comprises the amorphous phase, lubricity of the surface of each layer on the seed layer is properly improved to enable the interlayer coupling magnetic field (Hin) to come close to zero A/m.

The seed layer 22 is preferably formed with a thickness of 25 Å or more and 50 Å or less when no underlayer 6 is provided.

The upper limit of the thickness of the seed layer 22 was determined to be 50 Å because the proportion of shunt of the sense current to the seed layer 22 increases to largely decrease the rate of change of resistance (ΔR/R) by increasing the thickness of the seed layer 22, thereby making it impossible to obtain at least the same level of the rate of change of resistance as that in the related art. The seed layer 22 also becomes difficult to incorporate the amorphous phase when the thickness increases. The amorphous phase incorporated in the seed layer 22 permits the proportion of shunt of the sense current to the seed layer to be properly decreased since the amorphous phase has higher resistivity than the crystalline phase, or the rate of change of resistance to be improved.

The lower limit of the thickness of the seed layer 22 was determined to be 25 Å because, when the thickness is smaller than 25 Å, the seed layer 22 insufficiently grows with sparse density and uneven thickness to fail in improving wettability and lubricity of the seed layer 22. Moreover, crystal orientation in the antiferromagnetic layer 4 laminated on the seed layer 22 and crystal orientation in each layer formed on the antiferromagnetic layer become insufficient with a small mean crystal grain diameter. Consequently, the rate of change of resistance (ΔR/R) as well as the unidirectional exchange bias magnetic field (Hex*) are reduced while increasing the interlayer coupling magnetic field (Hin) due to deteriorated lubricity of the surface of the antiferromagnetic layer 4 formed on the seed layer 22.

The seed layer 22 is preferably formed with a thickness in the range of 25 Å or more and 50 Å or less in the present invention when no underlayer 6 is provided under the seed layer 22.

The seed layer 22 is more preferably formed with a thickness in the range of 25 Å or more and 40 Å or less in the present invention when no underlayer 6 is provided. The reason why the lower limit of the thickness of the seed layer 22 is determined to be 25 Å is as hitherto described.

Forming the seed layer 22 with a thickness of 40 Å or less permits the amorphous layer to be more properly incorporated in the seed layer 22 to properly suppress the sense current from shunting to the seed layer 22, thereby enabling the rate of change of resistance ($\Delta R/R$) to be properly improved. According to the experiments to be described hereinafter, it was shown that a rate of change of resistance of 10% or more can be obtained.

A unidirectional exchange bias magnetic field (Hex*) of about $11.85 \times 10^4$ A/m may be properly ensured by setting the thickness of the seed layer within the range of 25 Å or more and 40 Å or less.

It is more preferable in the present invention to form the seed layer 22 with a thickness of 30 Å or more and 40 Å or less.

The rate of change of resistance ($\Delta R/R$) may be reliably adjusted to 10% or more, and the unidirectional exchange coupling magnetic field (Hex*) may be increased to about $15.8 \times 10^4$ A/m or more while suppressing the interlayer coupling magnetic field (Hin) to 400 A/m or less, by setting the thickness of the seed layer 22 in the range of 30 Å or more and 40 Å or less.

Adjusting the thickness of the seed layer 22 to 30 Å or more and 40 Å or less permits the seed layer 22 to densely and uniformly grow, and wettability of the surface of the seed layer 22 to be improved by allowing the seed layer 22 to mainly comprise the amorphous layer. Accordingly, crystal orientation is improved while increasing the mean crystal grain diameter in each layer formed on the seed layer 22. Resistivity of the seed layer 22 may be increased since the layer contains a large proportion of the amorphous phase. Consequently, the sense current may be suppressed from shunting to the seed layer 22 to further improve the rate of change of resistance ($\Delta R/R$), thereby enabling the unidirectional exchange bias magnetic field (Hex*) to be further increased. Since the seed layer 22 mainly comprises the amorphous phase, lubricity of the surface of each layer on the seed layer 22 may be more properly improved to enable the interlayer coupling magnetic field (Hin) to come close to zero A/m.

Figure 4:
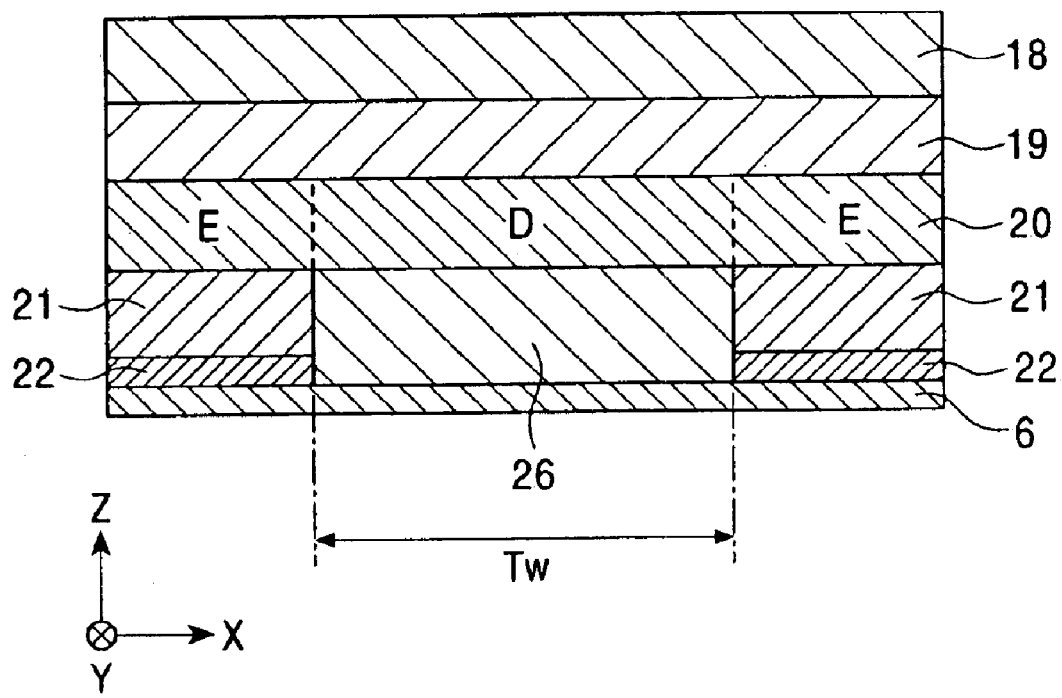
FIG. 4 is a cross section of the structure of the magnetic sensing element (AMR type magnetoresistive element) in a further different embodiment of the present invention viewed from the opposed face side to the recording medium.

FIG. 4 is a partial cross section of the anisotropic magnetoresistive element (AMR element) according to the present invention cut in a parallel direction to the opposed face to the recording medium.

A pair of seed layers 22 are formed with a space corresponding to a track width Tw in the track with direction (X-direction) on an underlayer 6. Exchange bias layers 21 are formed on the seed layers 22, and the spaces between each pair of the seed layers 22 and exchange bias layers 21 are filled with an insulation layer 26 formed of an insulation material such as $SiO_2$ and $Al_2O_3$.

A magnetoresistive layer (MR layer), a nonmagnetic layer (shunt layer) 19 and a soft magnetic layer (SAL) 18 are laminated on the exchange bias layers 21 and insulation layer 26.

The area E of the magnetoresistive layer 20 shown in FIG. 4 is magnetized as a single magnetic domain in the X-direction by an exchange coupling magnetic field generated at the interface between the exchange bias layers 21 and magnetoresistive layer 20 in the AMR type thin film element shown in FIG. 4. Magnetization of the area D in the magnetoresistive layer 20 is aligned in the X-direction by induction of an exchange coupling magnetic field. An electric current magnetic field generated by flowing a sense current in the magnetoresistive layer 20 is applied to the soft magnetic layer 18 in the Y-direction, and a transverse magnetic field is imparted to the area D in the magnetoresistive layer 20 in the Y-direction by a static magnetic coupling energy given from the soft magnetic layer 18. When the transverse magnetic field is applied to the area D of the magnetoresistive layer 20 put in a single domain state in the X-direction, the change of resistance of the area D of the magnetoresistive layer 20 is set to be linear against the change of magnetic field (magnetoresistive characteristics: H—R characteristics).

Since the travel direction of the recording medium is in the Z-direction, resistance of the area D in the magnetoresistive layer 20 changes by applying a leak magnetic field in the Y-direction, and the change of resistance is sensed as a change of voltage.

The seed layer 22 is also formed of Cr in this embodiment, and at least a part of the seed layer contains an amorphous phase.

Wettability of the surface of the seed layer 22 can be enhanced more than that in the related art by forming the seed layer 22 with Cr containing the amorphous phase while making the crystal grain diameter in each layer formed on the seed layer to be larger, thereby enabling the unidirectional exchange bias magnetic field (Hex*) in the magnetoresistive layer 20 to be increased. As a result, lubricity of the surface of each layer formed on the seed layer 22 may be also improved. The rate of change of resistivity ($\Delta R/R$) with same level as or larger than that in the related art may be also obtained.

Accordingly, electromigration resistance represented by electromigration resistance is improved, the interlayer coupling magnetic field (Hin) due to static magnetic coupling (topological coupling) between the magnetoresistive layer 20 and oft magnetic layer 18 is reduced, and asymmetry of the regenerative waveform is reduced in the present invention.

An AMR type thin film element capable of sufficiently complying with high density recording may be manufactured using the magnetic sensing element that manifest the effect according to the present invention, even when the sensing current density flowing in the magnetic sensing element is increased for high density recording in the future.

It is preferable in the present invention to form the seed layer 22 with a thickness of 15 Å or more and 50 Å or less.

The range of the thickness described above include the thickness of the underlayer 6 formed under the seed layer 22 as shown in FIG. 1.

Since the surface of the underlayer formed of Ta has a relatively good wettability, a more dense seed layer 22 comprising Cr may be formed on the entire underlayer, thereby enabling wettability of the surface of the seed layer 22 to be properly improved.

Furthermore, it has been confirmed by the experiments to be described hereinafter that the permissible range of the thickness of the seed layer for obtaining given magnitudes of the unidirectional exchange bias magnetic field (Hex*) and rate of change of resistance ($\Delta R/R$) can be expanded by forming the underlayer 6 as compared with the case having no underlayer 6.

The upper limit of the thickness of the seed layer 22 was determined to be 50 Å in the present invention because the proportion of shunt of the sense current to the seed layer 22 increases to largely decrease the rate of change of resistance ($\Delta R/R$) by increasing the thickness of the seed layer 22, thereby making it impossible to obtain at least the same level of the rate of change of resistance as that in the related art. In the seed layer 22, it also becomes difficult to incorporate the amorphous phase when the thickness increases. The amorphous phase incorporated in the seed layer 22 permits the proportion of shunt of the sense current to be properly decreased since the amorphous phase has higher resistivity than the crystalline phase, or the rate of change of resistance to be improved.

The lower limit of the thickness of the seed layer 22 was determined to be 15 Å because, when the thickness is smaller than 15 Å, the seed layer 22 insufficiently grows with sparse density and uneven thickness to fail in improving wettability and lubricity of the seed layer 22. Moreover, crystal orientation in the exchange bias layer 21 laminated on the seed layer 22 and crystal orientation in each layer formed on the antiferromagnetic layer become insufficient with a small mean crystal grain diameter. Consequently, the rate of change of resistance ($\Delta R/R$) as well as the unidirectional exchange bias magnetic field (Hex*) are reduced.

When the thickness of the seed layer 22 is 15 Å or less, the surface tend to be a rough surface because the seed layer 22 does not uniformly grow, thereby increasing the interlayer coupling magnetic field (Hin) to increase asymmetry of the regenerative output.

Accordingly, the seed layer 22 is formed with a thickness in the range of 15 Å or more and 50 Å or less.

It is more preferable in the present invention to form the seed layer 22 with a thickness of 15 Å to 40 Å. The reason why the lower limit of the thickness of the seed layer 22 is determined to be 15 Å is as hitherto described. The thickness of the seed layer 22 was determined to be 40 Å or less because the sense current is prevented from shunting to the seed layer 22 made of Cr, and the rate of change of resistance ($\Delta R/R$) may be properly improved by forming the seed layer with a thickness of 40 Å or less. The experiments to be described hereinafter showed that a rate of change of resistance of 10% or more can be reliably maintained.

It is further preferable that the seed layer 22 is formed with a thickness of 20 Å or more and 28 Å or less.

According to the experiment to be described hereinafter, setting the thickness of the seed layer 22 to be 20 Å or more and 28 Å or less permits the rate of change of resistance ($\Delta R/R$) to be 12% or more, the unidirectional exchange bias magnetic field (Hex*) to be about $15.8 \times 10^4$ A/m, and the interlayer coupling magnetic field (Hin) to come close to about zero A/m.

Forming the seed layer 22 with a thickness of 20 Å or more and 28 Å or less permits the seed layer 22 to densely grow with a uniform thickness while enabling wettability of the seed layer 22 to be sufficiently improved, and the seed layer 22 to be mainly composed of the amorphous phase. Consequently, the crystal orientation is improved and the mean crystal grain diameter is increased in each layer formed on the seed layer 22, and resistivity of the seed layer 22 is increased due to a large content of the amorphous phase in the seed layer (or because the seed layer is entirely composed of the amorphous layer). Therefore, the sense current is suppressed from shunting to the seed layer 22 to enable the rate of change of resistance ($\Delta R/R$) to be further improved while enabling the unidirectional exchange coupling bias magnetic field (Hex*) to be largely increased. Since the seed layer 22 is composed of an appropriate proportion of the amorphous phase, lubricity of the surface of each layer on the seed layer 22 may be more properly improved to enable the interlayer coupling magnetic field (Hin) to more properly come close to zero A/m.

The seed layer 22 is preferably formed with a thickness of 25 Å or more and 50 Å or less when no underlayer is provided.

The upper limit of the thickness of the seed layer 22 was determined to be 50 Å in the present invention because the proportion of shunt of the sense current to the seed layer 22 increases to largely decrease the rate of change of resistance ($\Delta R/R$) by increasing the thickness of the seed layer 22, thereby making it impossible to obtain at least the same level of the rate of change of resistance as that in the related art. In the seed layer 22, it also becomes difficult to incorporate the amorphous phase when the thickness increases. The amorphous phase incorporated in the seed layer 22 permits the proportion of shunt of the sense current to be properly decreased since the amorphous phase has higher resistivity than the crystalline phase, or the rate of change of resistance to be improved.

The lower limit of the thickness of the seed layer 22 was determined to be 25 Å because, when the thickness is smaller than 25 Å, the seed layer 22 insufficiently grows with sparse density and uneven thickness to fail in improving wettability and lubricity of the seed layer 22. Moreover, crystal orientation in the exchange bias layer 21 laminated on the seed layer 22 and crystal orientation in each layer formed thereon becomes insufficient with a small mean crystal grain diameter. Consequently, the rate of change of resistance ($\Delta R/R$) as well as the unidirectional exchange bias magnetic field (Hex*) are reduced. The interlayer coupling magnetic field (Hin) also increases due to deteriorated lubricity of the surface of the antiferromagnetic layer 4 and other layers formed on the seed layer 22.

Accordingly, it is preferable in the present invention to form the seed layer 22 with a thickness within the range of 15 Å or more and 50 Å or less when no underlayer 6 is provided under the seed layer 22.

It is more preferable to form the seed layer 22 with a thickness of 25 Å or more and 40 Å or less when no underlayer is provided. The reason why the lower limit of the thickness of the seed layer 22 is determined to be 25 Å or less is as hitherto described.

Forming the seed layer 22 with a thickness of 40 Å or less permits an appropriate proportion of the amorphous layer to be incorporated in the seed layer 22, the sense current to be suppressed from shunting to the seed layer 22 made of Cr, and the rate of change of resistance ($\Delta R/R$) to be properly improved. The experiments to be described hereinafter showed that a rate of change of resistance of 10% or more can be maintained.

A unidirectional exchange bias magnetic field (Hex*) of about $11.85 \times 10^4$ A/m can be properly ensured by forming the seed layer 22 with the thickness of 25 Å or more and 40 Å or less as described above.

It is further preferable in the present invention to form the seed layer 22 with a thickness of 30 Å or more and 40 Å or less.

The experiment to be described hereinafter showed that forming the seed layer 22 with a thickness of 30 Å or more and 40 Å or less permits the rate of change of resistance ($\Delta R/R$) to be reliably set to 10% or more, and the unidirectional exchange bias magnetic field (Hex*) to be about $15.8 \times 10^4$ A/m while suppressing the interlayer coupling magnetic field (Hin) to 400 A/m or less.

The seed layer 22 densely grows with a uniform thickness, wettability of the surface of the seed layer 22 is sufficiently improved, and the seed layer 22 is mainly composed of the amorphous phase by forming the seed layer 22 with a thickness of 30 Å or more and 40 Å or less. Consequently, crystal orientation is improved while increasing the mean crystal grain diameter, and resistivity of the seed layer is increased due to a large content of the amorphous phase in the seed layer 22 (or because the seed layer is completely made of the amorphous layer). As a result, the sense current is suppressed from shunting to the seed layer 22 to enable the rate of change of resistance ($\Delta R/R$) to be further improved while largely increasing the unidirectional exchange bias magnetic field (Hex*). Since the seed layer 22 mainly comprises the amorphous phase, lubricity of the surface of each layer on the seed layer 22 may be properly improved to enable the interlayer coupling magnetic field (Hin) to come close to zero A/m.

Figure 5:
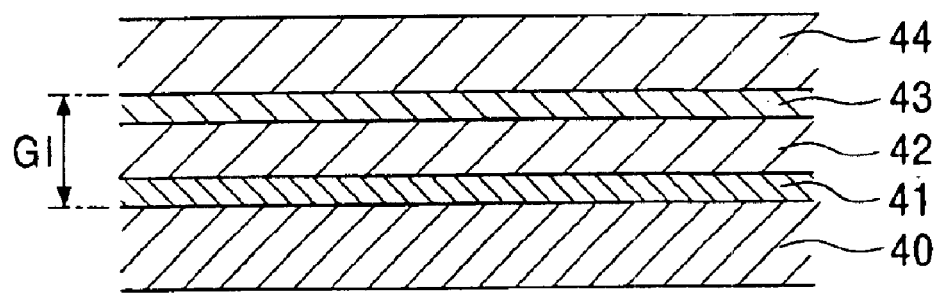
FIG. 5 is a partial cross section of a thin film magnetic head having the magnetic sensing element.

FIG. 5 shows a cross section of the structure of the read head, in which the magnetic sensing element shown in any one of FIGS. 1 to 4 is formed, viewed from the face side opposed to a recording medium.

The reference numeral 40 denotes a lower shield layer formed of, for example, a NiFe alloy, and a lower gap layer 41 is formed on the lower shield layer 40. The magnetic sensing element 42 shown in any one of FIGS. 1 to 4 is formed on the lower gap layer 41, an upper gap layer 43 is formed on the magnetic sensing element 42, and an upper shield layer made of the NiFe alloy is formed on the upper gap layer 43.

The seed layer 22 is directly formed on the lower gap layer 41 when no underlayer 6 is formed under the seed layer 22 in the magnetic sensing element shown in FIGS. 1 to 4. Alternatively, the seed layer 22 is formed, for example, on the electrode layer when the magnetic sensing element show in any one of FIGS. 1 to 4 is a tunnel type magnetic sensing element or a CPP type magnetic sensing element.

The lower and upper gap layers 41 and 43 are formed of an insulation material such as $SiO_2$ and $Al_2O_3$. As shown in FIG. 5, the length from the lower gap layer 41 to the upper gap layer 43 corresponds to the gap length G1. The shorter the gap length G1 is, the more readily the magnetic sensing element can comply with high density recording.

A large exchange coupling magnetic field can be generated in the present invention even when the thickness of the antiferromagnetic layer 4 is small. The antiferromagnetic layer 4 is formed, for example, with a thickness of 70 Å or more, which is a sufficiently small thickness of the antiferromagnetic layer 4 as compared with the thickness of about 300 Å in the related art. Production of the thin film magnetic head that is able to comply with high density recording is made possible by narrowing the gap.

A write inductive head may be formed on the upper shield layer 44.

The magnetic sensing element according to the present invention is capable of using as a magnetic sensor other than the magnetic head integrated in a hard disk device.

The method for manufacturing the magnetic sensing element according to the present invention will be described hereinafter.

The seed layer 22 is deposited by sputtering on the underlayer 6 in the first step of the method according to the present invention. The underlayer 6 is preferably formed of at least one element of Ta, Hf, Nb, Zr, Ti, Mo and W. Forming the underlayer 6 permits the seed layer 22 formed thereon to be a dense film, and enables wettability of the surface of the seed layer 22 to be properly improved.

A target made of Cr is used for depositing the seed layer 22 by sputtering.

It is preferable in deposition of the seed layer 22 to control the temperature of the substrate 25 for depositing the seed layer 22 by sputtering at 20 to 100° C., the distance between the substrate 25 and target at 40 to 80 mm, and the pressure of the Ar gas introduced during deposition by sputtering at 0.5 to 3 mTorr (0.067 to 0.4 Pa).

The seed layer 22 is formed with a thickness of 15 Å or more and 50 Å or less when the seed layer 22 is formed on the underlayer 6. These thickness and film deposition conditions permit an amorphous phase to be incorporated in at least a part of the seed layer 22.

The seed layer 22 is formed with a more preferable thickness of 15 Å or more and 40 Å or less, and with a further preferable thickness of 20 Å or more and 28 Å or less. The seed layer 22 is made to have a film structure mainly comprising the amorphous phase by forming the layer with a thickness in the range as described above.

The seed layer is formed with a thickness of 25 Å or more and 50 Å or less, more preferably with a thickness of 25 Å or more and 40 Å or less, and further preferably with a thickness of 30 Å or more and 40 Å or less, when no underlayer 6 is provided under the seed layer 22. The seed layer 22 is made to have a film structure mainly comprising the amorphous phase by forming the layer with a thickness in the range as described above.

Then, the antiferromagnetic layer 4 is deposited by sputtering on the seed layer 22.

It is preferable in the present invention to form the antiferromagnetic layer 4 by depositing an antiferromagnetic material comprising an element X (X denotes one or plural elements of Pt, Pd, Ir, Rh, Ru and Os) and Mn by sputtering.

The antiferromagnetic layer 4 may be formed by depositing a X—Mn—X' alloy (the element X' is one or plural elements of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements) by sputtering in the present invention.

It is preferable in the present invention to adjust the composition ratio of the element X or elements X+X' to be 45 at % or more and 60 at % or less.

Subsequently, a pinned magnetic layer 3, nonmagnetic layer 2, free magnetic layer 1, backed layer 15 and protective layer 7 are deposited on the antiferromagnetic layer 4.

As hitherto described, wettability of the surface of the seed layer 22 may be sufficiently enhanced than that in the related art by forming the seed layer 22 with Cr an amorphous phase in at least a part of the seed layer. The unidirectional exchange bias magnetic field (Hex*) in the pinned magnetic layer 3 can be made to be greater than that in the related art in the heat treatment step to be applied thereafter, since each layer formed on the seed layer 22 can be readily grown as lamellae with a larger crystal grain diameter than that in the related art.

Wettability of the surface of each layer formed on the seed layer 22 may be improved due to quite high wettability of the seed layer 22 as well as by allowing the amorphous phase to be incorporated in at least a part of the seed layer.

EXAMPLE

The structure of the seed layer, and crystalline state of the antiferromagnetic layer formed on the seed layer were investigated using the seed layer formed of Cr as an example, and the seed layer formed of NiFeCr as a comparative example.

The magnetic sensing element in the example comprises, from the bottom to the top, Si substrate/alumina(1000)/underlayer: Ta(32)/seed layer: Cr(20)/antiferromagnetic layer(120): $Pt_{50at\%}Mn_{50at\%}$/pinned magnetic layer: $[Co_{90at\%}Fe_{10at\%}(16)/Ru(9)/Co_{90at\%}Fe_{10at\%}(22)]$/nonmagnetic layer: Cu(21)/free magnetic layer: $[Co_{90at\%}Fe_{10at\%}(10)/Ni_{80at\%}Fe_{20at\%}(18)]$/backed layer: Cu(10)/protective layer: Ta(30). The figure in the parenthesis denotes the thickness of each layer in angstrom unit.

After sputtering each layer, the element was heat treated at 290° C. for about 4 hours in a magnetic field with an intensity of 800 kA/m.

The magnetic sensing element in the comparative example comprises, from the bottom to the top, Si substrate/alumina(1000)/underlayer: Ta(32)/seed layer: $(Ni_{0.8}Fe_{0.2})_{60at\%}Cr_{40at\%}(55)$/antiferromagnetic layer: $Pt_{50at\%}Mn_{50at\%}(200)$/pinned magnetic layer: $[Co_{90at\%}Fe_{10at\%}(15)/Ru(9)/Co_{90at\%}Fe_{10at\%}(22)]$/nonmagnetic layer: Cu(21)/free magnetic layer: $[Co_{90at\%}Fe_{10at\%}(10)/Ni_{80at\%}Fe_{20at\%}(32)]$/backed layer: Cu(17)/protective layer: Ta(20). The figure in the parenthesis denotes the thickness of each layer in angstrom unit.

After sputtering each layer, the element was heat treated at 290° C. for about 4 hours in a magnetic field with an intensity of 800 kA/m.

Figure 6:
FIG. 6 shows a transmission electron microscopic photograph of the magnetic sensing element when a seed layer comprising Cr with a thickness of 20 Å (in an example) is formed on a Ta film, and an electron diffraction pattern of the seed layer.

FIG. 6 shows a transmission electron microscopic photograph of the magnetic sensing element having the layer structure described above, and FIG. 7 is a schematic representation of a part of the photograph shown in FIG. 6.

Figure 7:
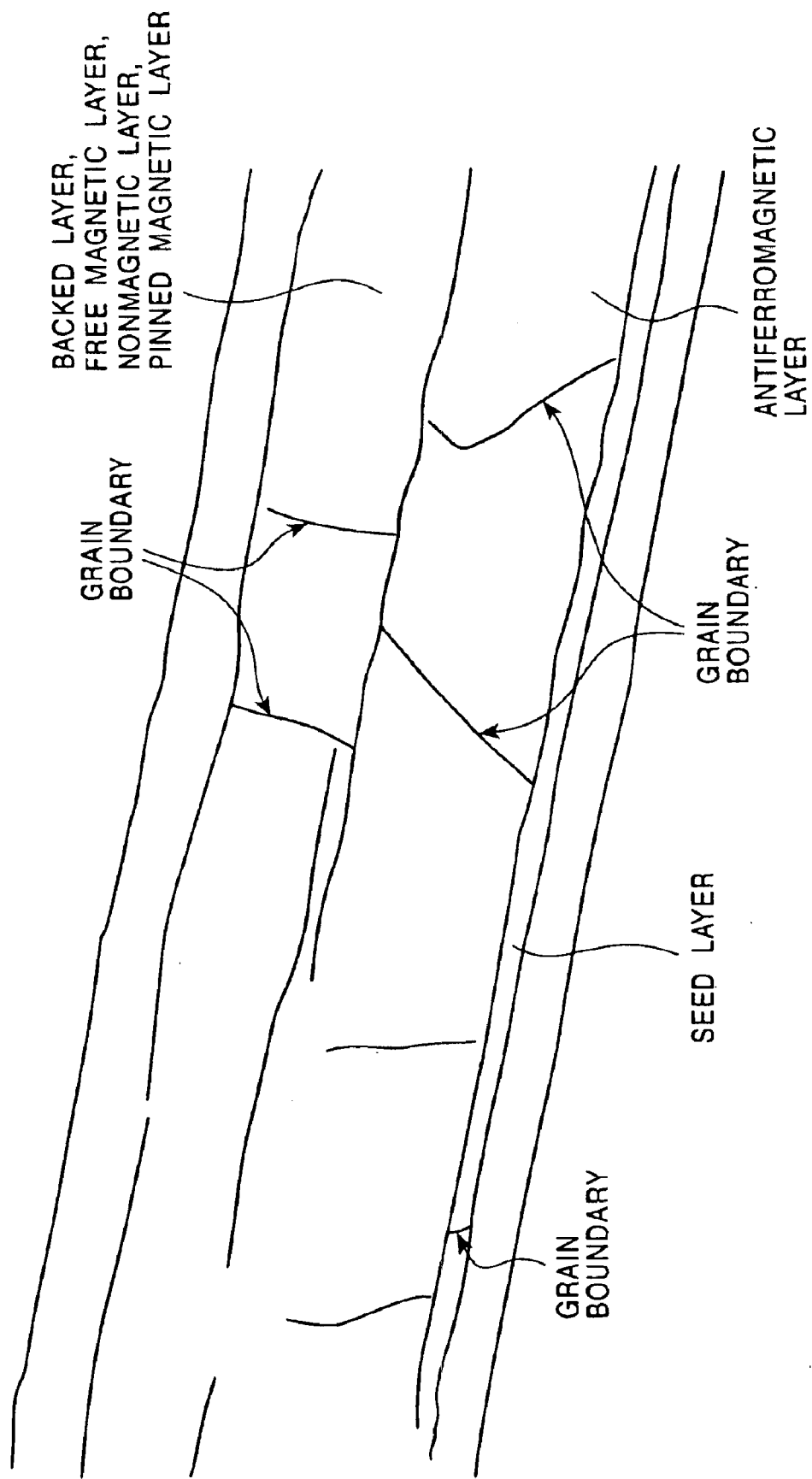
FIG. 7 is a schematic representation of a part of the photograph shown in FIG. 6.

As shown in FIGS. 6 and 7, the surface of the antiferromagnetic layer formed on the Cr seed layer, and the surface of the pinned layer formed on the antiferromagnetic layer had small undulations, showing good lubricity of the surface of each layer.

The mean crystal grain size in the direction parallel to the surface of each layer formed on the seed layer 22 was about 220 Å, indicating that the crystal had grown with large grain diameters.

As shown in FIGS. 6 and 7, the crystal grain boundaries formed in the antiferromagnetic layer is discontinuous to the crystal grain boundaries in the pinned magnetic layer, showing that the boundaries are discontinuous at the interface between these two layers.

It is also shown that the crystal grain boundaries formed in the seed layer is discontinuous to the crystal grain boundaries in the antiferromagnetic layer.

While lattice stripes are partly visible under the electron microscope, some parts are not clearly visible with blurred lattice stripes.

For investigating the layer structure of the seed layer, an electron diffraction pattern was measured at a part of the seed layer. The electron diffraction pattern obtained is attached at the lower left in FIG. 6.

As shown in FIG. 6, a broad ring (a halo) showing the presence of an amorphous phase is seen together with diffraction spots showing the presence of a face-centered cubic structure in the crystalline phase.

The diffraction pattern shows that the Cr seed layer shown in FIG. 6 is in a mixed sate of the amorphous phase and crystalline phase.

Figure 8:
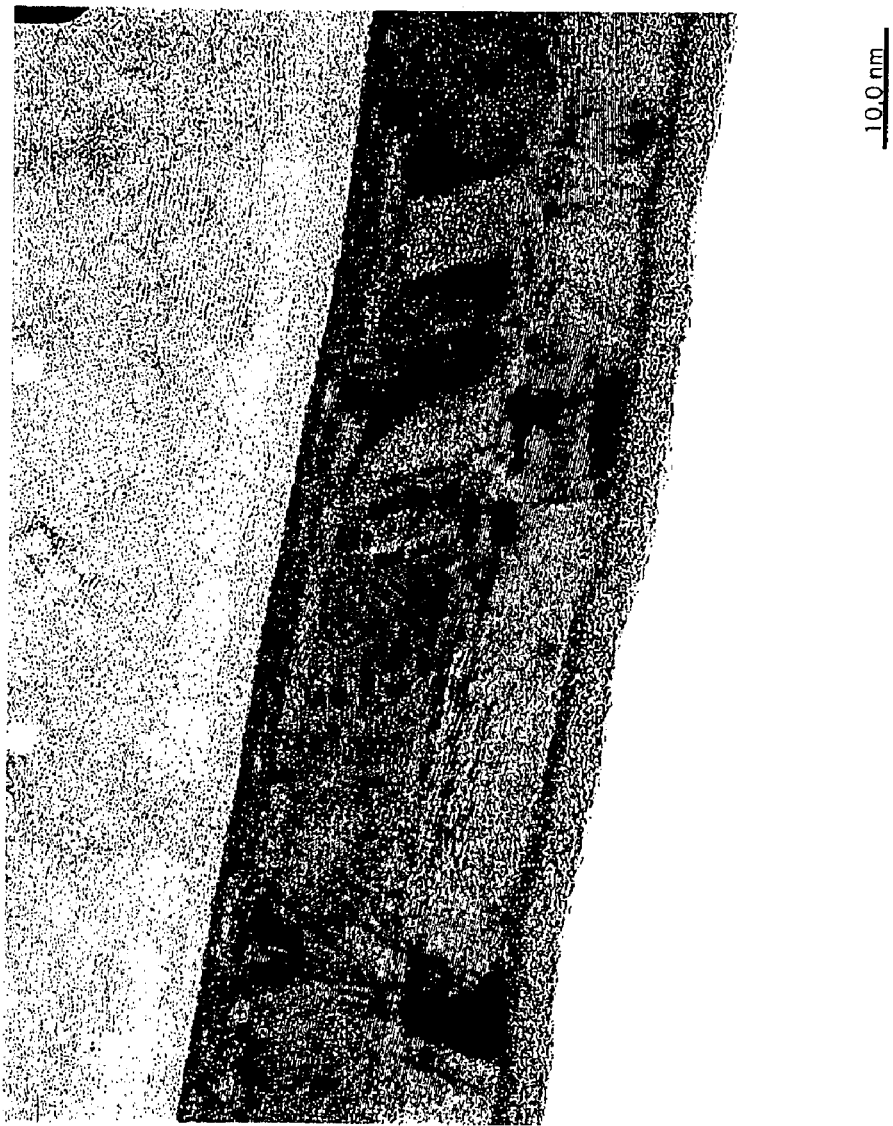
FIG. 8 shows a transmission electron microscopic photograph of the magnetic sensing element when a seed layer comprising Cr with a thickness of 20 Å. (in an example, viewed from a direction different from that in FIG. 6) is formed on a Ta film.
Figure 9:
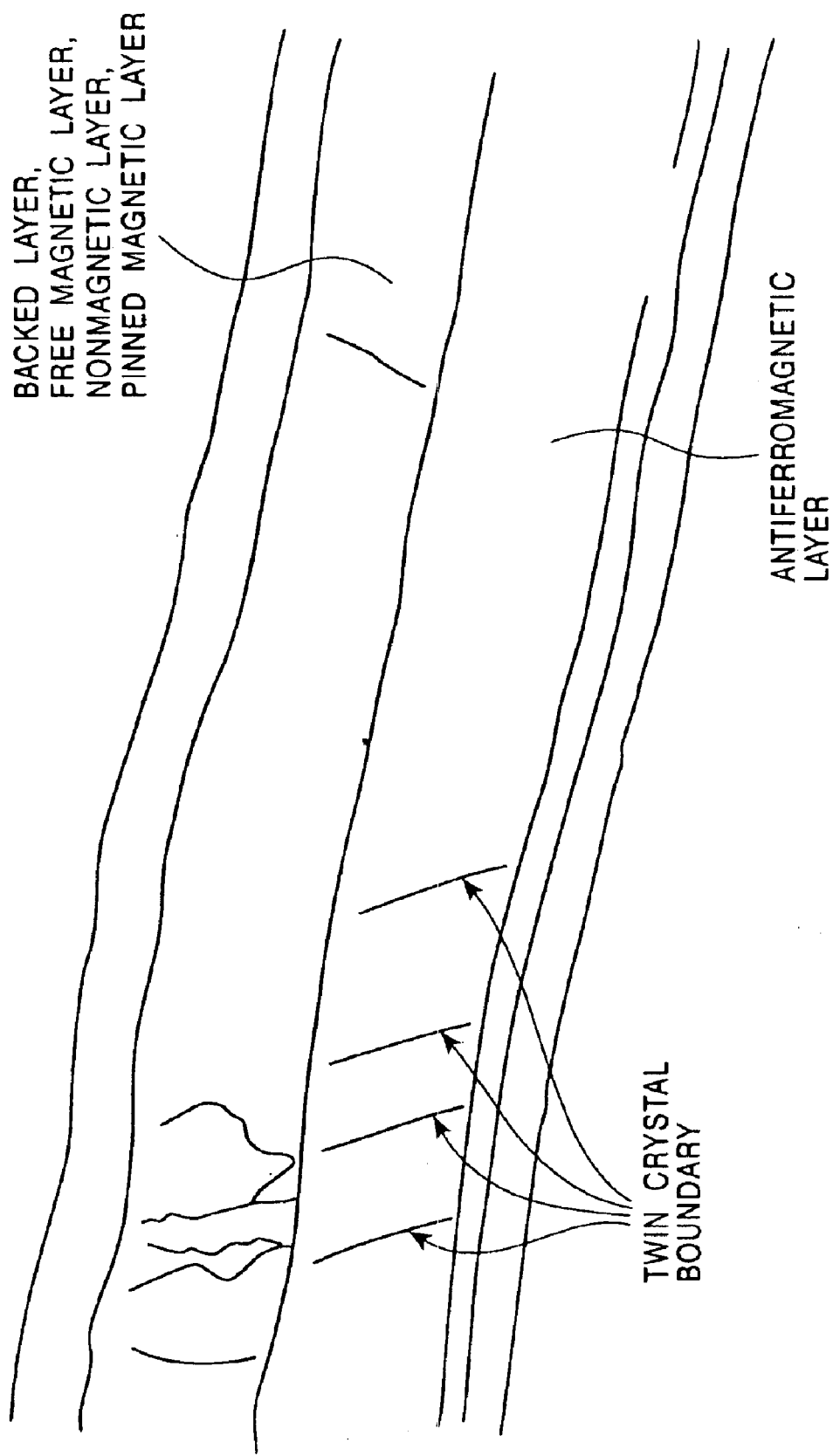
FIG. 9 is a schematic representation of a part of the photograph shown in FIG. 8.

FIG. 8 shows a transmission electron microscopic photograph of the cross section of the magnetic sensing element in the example cut at a different position from that in FIG. 6, and FIG. 9 is a schematic representation of a part of the photograph shown in FIG. 8.

As shown in FIGS. 8 and 9, the surface of the antiferromagnetic layer formed on the Cr seed layer, and the surface of the pinned magnetic layer formed on the antiferromagnetic layer have small undulations, and the surface of each layer has quite excellent lubricity.

Figure 10:
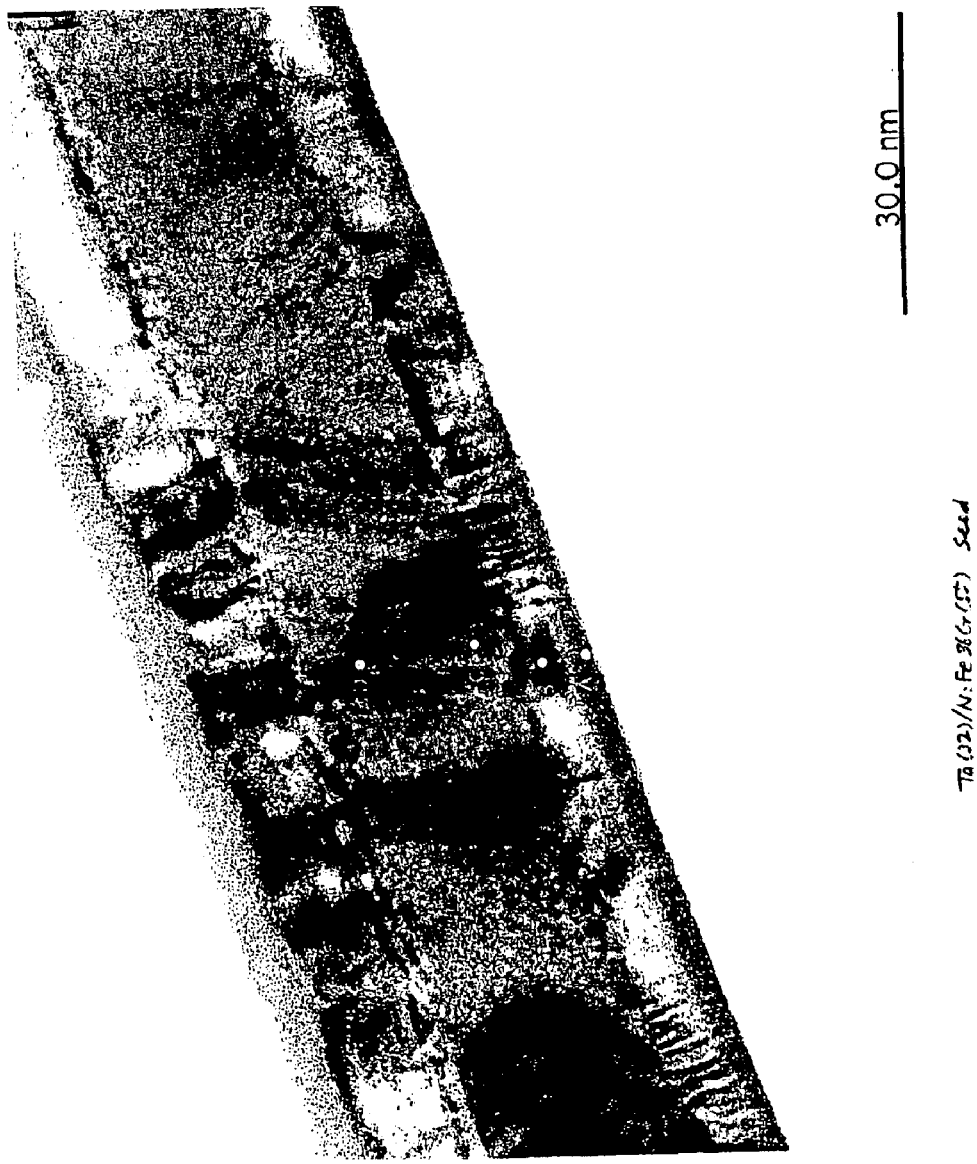
FIG. 10 shows a transmission electron microscopic photograph of the magnetic sensing element when a seed layer comprising a NiFeCr alloy with a thickness of 55 Å (Cr content of 40 at %) is formed on a Ta film.

FIGS. 8 and 9 also show that twin crystals are formed in the antiferromagnetic layer, and twin crystal boundaries are formed to be non-parallel to the interface between the seed layer and antiferromagnetic layer. FIG. 10 shows a transmission electron microscopic photograph of the magnetic sensing element having the layer construction in the comparative example, and FIG. 11 is a schematic illustration of a part of the transmission electron microscopic photograph shown in FIG. 10.

Figure 11:
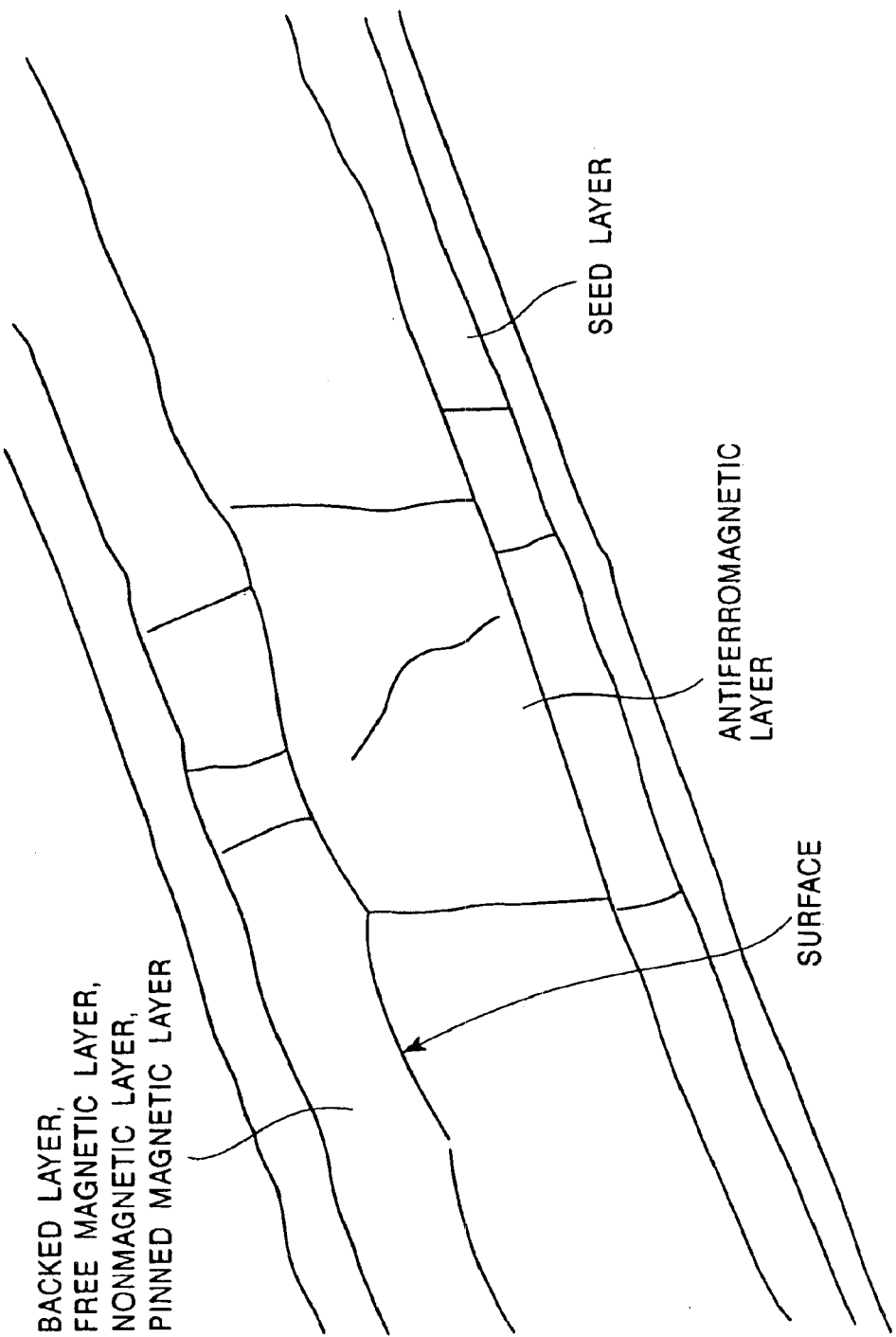
FIG. 11 is a schematic representation of a part of the photograph shown in FIG. 10.

As shown in FIGS. 10 and 11, the surface of the antiferromagnetic layer formed on the NiFeCr seed layer, and the surface of the pinned magnetic layer formed on the ferromagnetic layer have severe undulations with not so excellent lubricity of the surface of each layer.

Lattice stripes are clearly visible at the part of the seed layer in the electron microscopic photograph shown in FIG. 10, suggesting that the seed layer in the comparative example comprises the crystalline phase only. The crystalline phase above was a face-centered cubic structure (fcc structure).

In comparison of the example in FIGS. 6, 7, 8 and 9 with the comparative example in FIGS. 10 and 11, it was shown that the example is superior to the comparative example in lubricity of the surfaces of the antiferromagnetic layer and the other layers such as the pinned magnetic layer. This is considered to be due to the facts that the Cr seed layer has better wettability than the NiFeCr seed layer, and the Cr seed layer has such a small thickness (about 20 Å) that the amorphous phase is mixed in a part of the layer structure.

The unidirectional exchange coupling bias magnetic field (Hex*), interlayer coupling magnetic field (Hin), rate of change of resistance (ΔR/R) and mean crystal diameter of the example and comparative example (named as the example 1 hereinafter) are summarized in the table below. The experimental results with respect to the magnetic sensing element with the layer construction below is also shown in the table as the comparative example 2.

The magnetic sensing element in the comparative example 2 comprises, from the bottom to the top, Si substrate/alumina (1000)/underlayer: Ta(32)/antiferromagnetic layer: $Pt_{50at\%}Mn_{50at\%}(120)$/pinned magnetic layer: $[Co_{90at\%}Fe_{10at\%}(15)/Ru(9)/Co_{90at\%}Fe_{10at\%}(22)]$/nonmagnetic layer(21)/free magnetic layer: $[Co_{90at\%}Fe_{10at\%}(10)/Ni_{80at\%}Fe_{20at\%}(32)]$/backed layer: Cu(17)/protective layer (20) The figure in the parenthesis denote the layer thickness in an angstrom unit.

After depositing each layer by sputtering, the magnetic sensing element was heat treated at 290° C. for abut 4 hours in a magnetic field with an intensity of 800 kA/m.

As shown in the layer construction above, no seed layer is provided in the comparative example 2.

TABLE 1

| | TEM PHOTO- GRAPH | LAYER CON- STRUC- TION | ANNELING CONDITION | UNDERLAYER/ SEED LAYER | CRYSTAL STRUCTURE OF SEED LAYER | UNDIREC- TIONAL EXCHANGE BIAS MAGNETIC FIELD (Oe) (A/m) | ΔR/R (%) | INTERLAYER COUPLING MAGNETIC FIELD (Oe) (A/m) | MEAN CRYSTAL GRAIN DIAMETER IN LAYER DIRECTION (Å) |
|---|---|---|---|---|---|---|---|---|---|
| EXAMPLE | FIG. 6 | #1 | HEAT TREATMENT IN MAGNETIC FIELD 290° C. × 3 hr 40 min 800 kA/m | Ta(32 Å)/ Cr(20 Å) | AMORPHOUS (MAIN) + bcc-Cr | 1884 Oe 1.5 × 10$^5$ (A/m) | 12.3 | 0.4 (Oe) 31.6 (A/m) | 217 Å |
| COMPARA- TIVE EXAMPLE 1 | FIG. 8 | #2 | HEAT TREATMENT IN MAGNETIC FIELD 290° C. × 3 hr 40 min 800 kA/m | Ta(32 Å)/ (Ni$_{0.8}$Fe$_{0.2}$)$_{60}$ Cr$_{40}$(55 Å) | fcc | 1773 Oe 1.4 × 10$^5$ (A/m) | 11.8 | 7.8 (Oe) 616.2 (A/m) | 197 Å |
| COMPARA- TIVE EXAMPLE 2 | NON | #3 | HEAT TREATMENT IN MAGNETIC FIELD 290° C. × 3 hr 40 min 800 Ka/m | Ta(32 Å) | — | 987 Oe 0.77 × 10$^5$ (A/m) | 8.72 | 8.5 (Oe) 671.5 (A/m) | — |

1 Si substrate/alumina(1000Å)/Ta(32Å)/Cr(20Å)/Pt$_{50}$Mn$_{50}$(120Å)/Co$_{90}$Fe$_{10}$(16Å)/Ru(9Å)/Co$_{90}$Fe$_{10}$(22Å)/Cu(21Å)/ Co$_{90}$Fe$_{10}$(10Å)/Ni$_{80}$Fe$_{20}$(18Å)/Cu(10Å)/Ta(30Å)
2 Si substrate/alumina(1000Å)/Ta(32Å)/(Ni$_{0.8}$Fe$_{0.2}$)$_{60}$Cr$_{40}$(55Å)/Pt$_{50}$Mn$_{50}$(200Å)/Co$_{90}$Fe$_{10}$(15Å)/Ru(9Å)/ Co$_{90}$Fe$_{10}$(22Å)/Cu(21Å)/Co$_{90}$Fe$_{10}$(10Å)/Ni$_{80}$Fe$_{20}$(32Å)/Cu(17Å)/Ta(20Å)
3 Si substrate/alumina(1000Å)/Ta(32Å)/Pt$_{50}$Mn$_{50}$(120Å)/Co$_{90}$Fe$_{10}$(15Å)/Ru(9Å)/Co$_{90}$Fe$_{10}$(22Å)/Cu(21Å)/Co$_{90}$Fe$_{10}$(10Å)/Ni$_{80}$Fe$_{20}$(32Å)/Cu(17Å)/Ta(20Å)

As shown in Table 1, the structure of the seed layer in the example is a mixed state of the amorphous phase and body-centered cubic structure (bcc structure), while the structure of the seed layer in the comparative example 1 is the face-centered cubic structure (fcc structure).

The unidirectional exchange coupling magnetic field (Hex*) is shown to be higher in the example than in the comparative examples 1 and 2. This is conjectured to arise from the facts that wettability of the surface of the seed layer was able to be markedly improved by using Cr as the material of the seed layer, thereby enabling the crystal grain diameter in each layer formed on the seed layer to be increased.

The rate of change of resistance (ΔR/R) is higher in the example than in the comparative examples 1 and 2. This is probably due to the fact that the crystal grain diameter in each layer formed on the seed layer is larger in the example than in the comparative examples 1 and 2. The mean crystal grain diameter in the layer surface direction described in the right end column of the table is 217 Å in the example while that in the comparative example 1 is 197 Å, showing that the mean crystal grain diameter is smaller in the comparative example 1 than in the example. The larger crystal grain diameter in the example than in the comparative examples may be anticipated from the fact that the distance between the crystal grains on each layer shown in FIGS. 7 to 11 is larger in the example than in the comparative example.

The rate of change of resistance (ΔR/R) is considered to be improved in the example over the comparative examples, since the crystal grain diameter is as large as 200 Å in the example. It may be a crucial factor for improving the rate of change of resistance (ΔR/R) in the example that the seed layer is as thin as 20 Å, and the proportion of the sense current shunting to the seed layer is small.

The interlayer coupling magnetic field (Hin) will be described hereinafter. The interlayer coupling magnetic field (Hin) is defined as the interlayer coupling magnetic field (Hin) between the free magnetic layer and pinned magnetic layer mediated by the nonmagnetic layer. A coupling force for directing the magnetization direction of the free magnetic layer to a direction parallel to the magnetization direction of the pinned magnetic layer is applied when Hin is positive, while a coupling force for directing the magnetization direction of the free magnetic layer to a direction antiparallel to the magnetization direction of the pinned magnetic layer is applied when Hin is negative.

Reducing the interlayer coupling magnetic field (Hin) permits magnetization of the free magnetic layer to be readily oriented in the direction intersecting the magnetization direction of the pinned magnetic layer, thereby enabling asymmetry of the regenerative waveform to be reduced.

With reference to Table 1, the interlayer coupling magnetic field (Hin) is very small in the example as compared with the comparative examples 1 and 2. The interlayer coupling magnetic field (Hin) is shown to be close to zero A/m in the example. This is considered to arise from the fact that undulations on the surface of each layer formed on the seed layer are smaller in the example than in the comparative examples, showing good lubricity.

A magnetic sensing element comprising the following layer structure was formed using the seed layer formed of Cr, and a preferable range of the thickness of the seed layer was derived from the relation between the unidirectional exchange bias magnetic field and the rate of change of resistance in the pinned layer.

The seed layer used for the experiment comprises, from the bottom to the top, substrate/seed layer: Cr(X)/ antiferromagnetic layer: PtMn(120)/pinned magnetic layer [CoFe(16)/Ru(8.7)/CoFe(22)]/nonmagnetic layer: Cu(21)/ free magnetic layer: [CoFe(10)/Ni$_{80at}$ $_%$Fe$_{20at}$ $_%$(18)]/ backed layer: Cu(10)/protective layer: Ta(30). The figure in the parenthesis denotes the film thickness in an angstrom unit.

A magnetic sensing element comprising the seed layer with the construction above and a Ta layer (32 Å) between the substrate and the seed layer was also used for the experiment.

For depositing the seed layer formed of Cr, the pressure of the Ar gas introduced for film deposition by sputtering was adjusted to 1 mTorr, the electric power supplied to the sputtering target was set to 100 W, and the distance between the target and substrate was set at about 7 cm.

After depositing the magnetic sensing element having the layer construction described above, it was annealed in a magnetic field of 800 kA/m for about 4 hours at 290° C.

Figure 12:
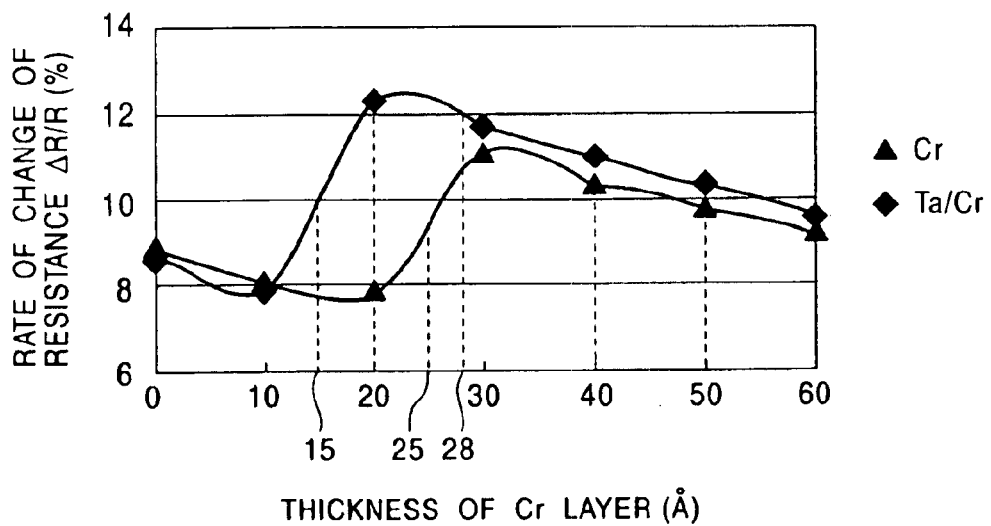
FIG. 12 is a graph showing the relations between the film thickness and rate of change of resistance of the seed layers formed of Cr and formed of Cr on Ta, respectively.

FIG. 12 is a graph showing the relation between the thickness of the seed layer formed of Cr and the rate of change of resistance ($\Delta R/R$).

As shown in FIG. 12, it was revealed that a rate of change of resistance of about 10% or more can be obtained by controlling the thickness of the Cr layer at 15 Å or more and 50 Å or less from the results of experiments using a [Ta/Cr] layer comprising a Ta layer provided under the seed layer. The rate of change of resistance decreases when the thickness of the Cr layer is 50 Å or more, since the proportion of the sense current shunting to the seed layer 22 increases.

In the experiment using the Cr layer having no Ta layer under the seed layer, it was shown that a rate of change of resistance of about 10% or more can be obtained when the thickness of the Cr layer is 25 Å or more and 50 Å or less.

It was also shown that a rate of change of resistance of about 10% or more can be reliably obtained by reducing the thickness of the Cr layer to 40 Å or less, irrespective of the presence or absence of the Ta layer.

A rate of change of resistance of as high as 12% or more can be obtained by further reducing the thickness of the Cr layer to 20 Å or more and 28 Å or less in the experiment using the [Ta/Cr] seed layer as shown in FIG. 12.

In the experiment using the [Cr] seed layer, a rate of change of resistance of 10% or more can be more reliably obtained by adjusting the thickness of the Cr layer to 30 Å or more and 40 Å or less.

Figure 13:
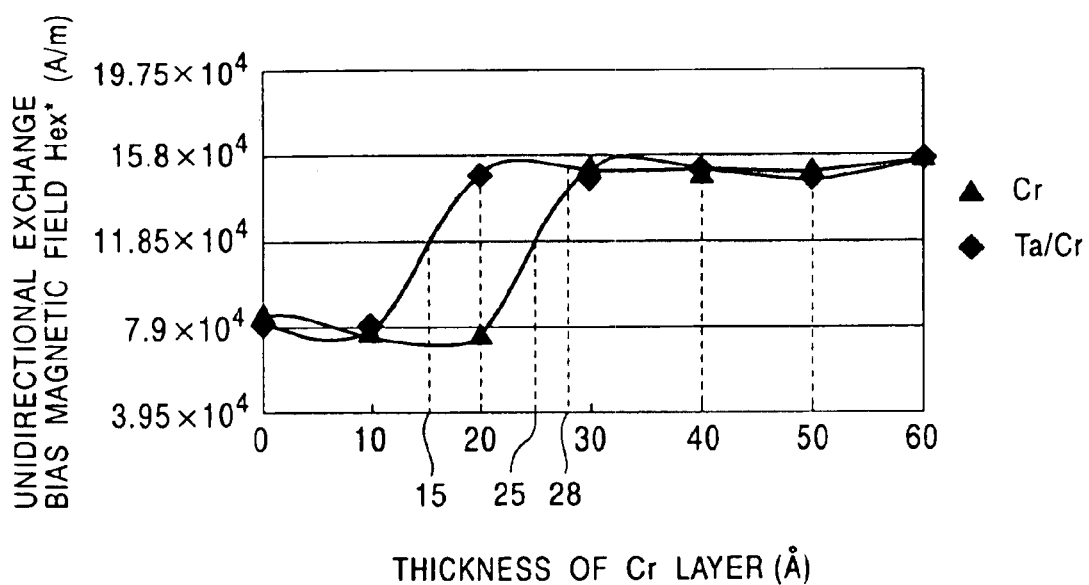
FIG. 13 is a graph showing the relations, between the film thickness and unidirectional exchange bias magnetic field (Hex*) of the pinned magnetic layer in the seed layers formed of Cr and formed of Cr on Ta, respectively.

FIG. 13 is a graph showing the relation between the unidirectional exchange coupling magnetic field (Hex*) and the thickness of the seed layer formed of Cr.

It was shown from the experiment using the [Ta/Cr] layer comprising the Ta layer under the Cr seed layer that a unidirectional exchange bias magnetic field (Hex*) of as high as about $11.85 \times 10^4$ A/m (15000 Oe) is obtained when the thickness of the Cr layer is 15 Å or more.

In the experiment using the [Cr] layer having no Ta layer under the Cr seed layer, on the other hand, a unidirectional exchange bias magnetic field (Hex*) of as high as about $11.85 \times 10^4$ A/m (15000 Oe) is obtained when the thickness of the Cr layer is 25 Å or more.

In the experiment of the unidirectional exchange bias magnetic field (Hex*) shown in FIG. 13, the vale of the unidirectional exchange bias magnetic field (Hex*) does not decrease as in the experiment of the rate of change of resistance shown in FIG. 12 even when the thickness of the seed layer is increased.

As shown in FIG. 13, it was shown from the experiment of the [Ta/Cr] layer that a unidirectional exchange bias magnetic field (Hex*) of as high as about $15.8 \times 10^4$ A/m (15000 Oe) is obtained when the thickness of the Cr layer is 20 Å or more.

It was also shown from the experiment of the [Cr] layer that a unidirectional exchange bias magnetic field (Hex*) of about $15.8 \times 10^4$ A/m is obtained at a thickness of the Cr layer of 30 Å or more.

Figure 14:
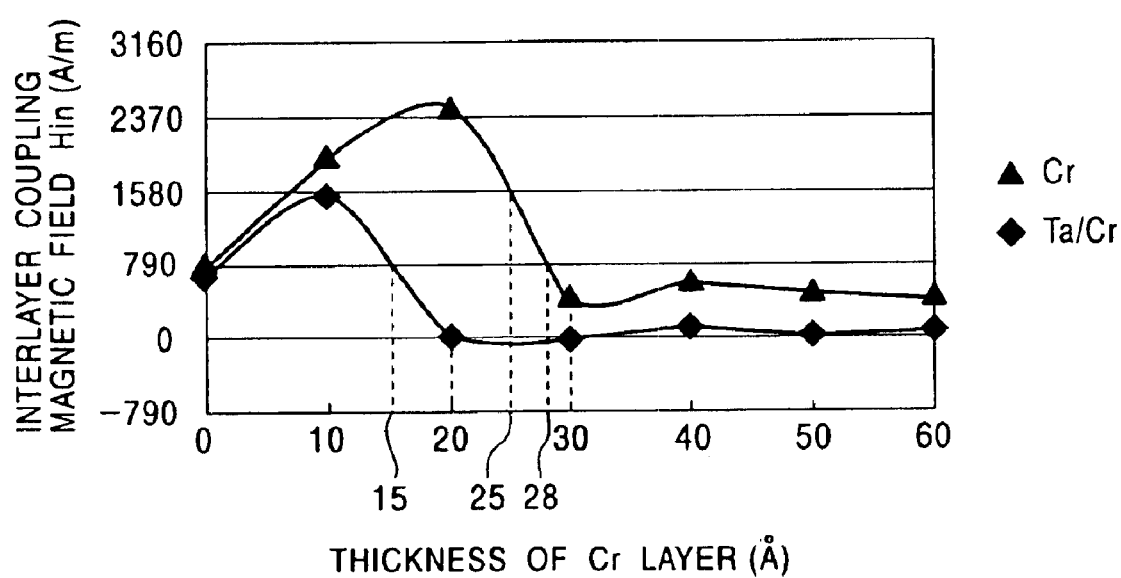
FIG. 14 is a graph showing the relations between the film thickness and interlayer coupling magnetic field (Hin) in the seed layers formed of Cr and formed of Cr on Ta, respectively.
Figure 15:
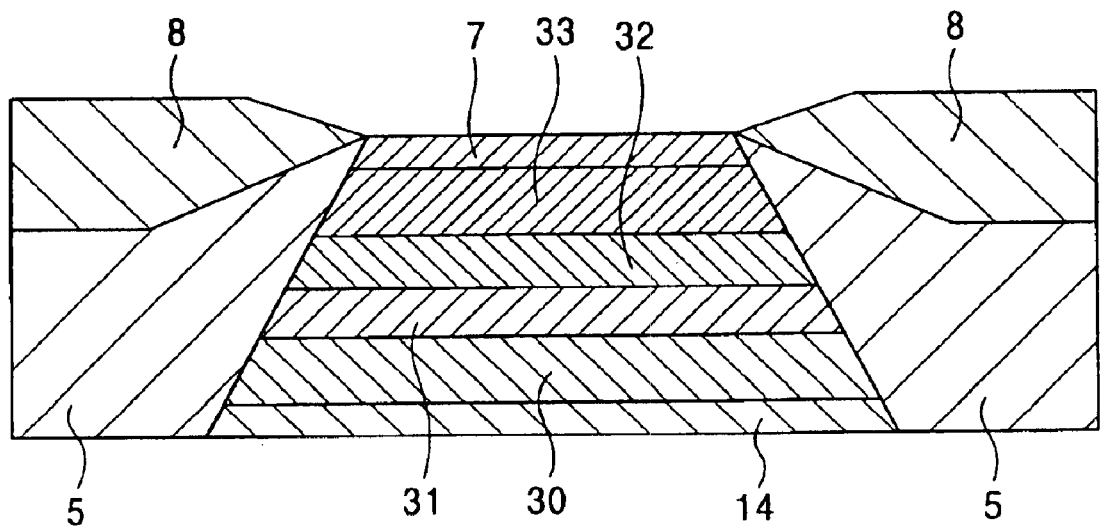
FIG. 15 is a partial cross section of the magnetic sensing element in the related art viewed from the opposed side to the recording medium.
Figure 16:
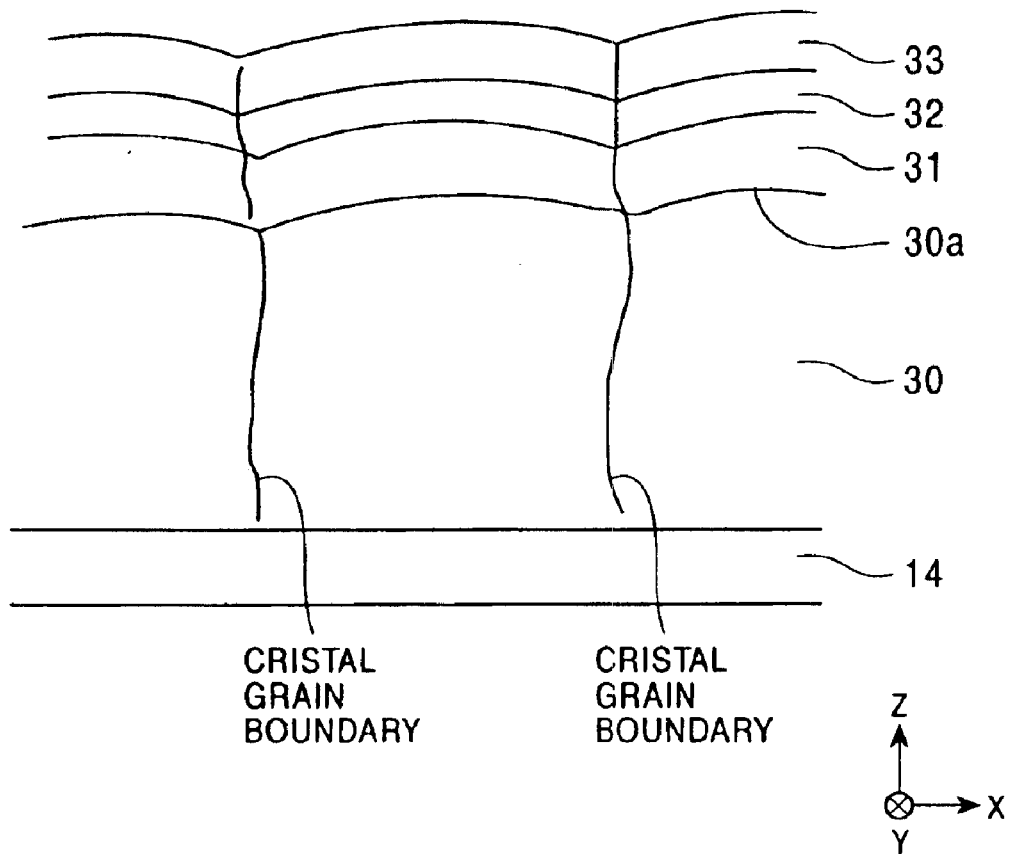
FIG. 16 is a partial schematic view showing a partially magnified layer structure of the magnetic sensing element shown in FIG. 15.
Figure 17:
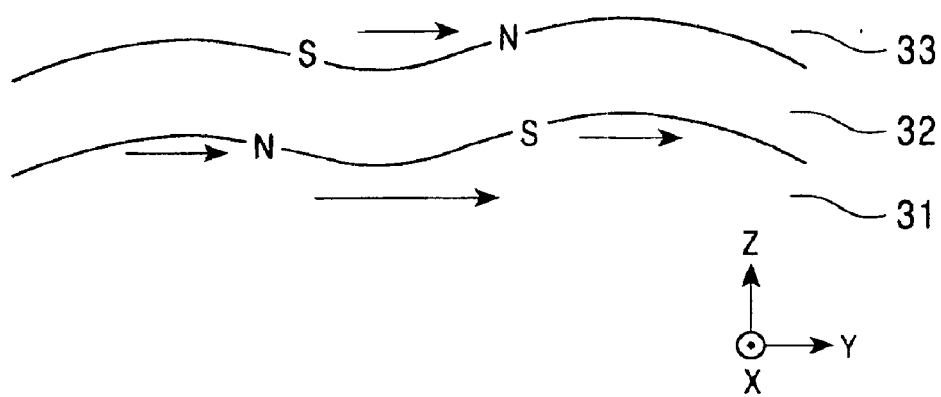
FIG. 17 is a partial schematic view showing a partially magnified layer structure of the pinned magnetic layer, nonmagnetic layer and free magnetic layer shown in FIG. 16.

FIG. 14 is a graph showing the relation between the thickness of the seed layer and the interlayer coupling magnetic field (Hin).

As shown in FIG. 14, the experiment using the [Ta/Cr] layer having the Ta layer under the seed layer shows that an interlayer coupling magnetic field (Hin) of about 790 A/m (10 Oe) is obtained at a thickness of the seed layer of 15 Å or more. It is particularly preferable that the thickness of the seed layer is 20 Å or more for allowing the interlayer coupling magnetic field (Hin) to come close to zero A/m.

The experiment using the [Cr] layer having no Ta layer under the seed layer shows that an interlayer coupling magnetic field (Hin) of 1580 A/m (20 Oe) or less is obtained at a thickness of the seed layer of 25 Å or more. A thickness of the seed layer of 30 Å or more is particularly preferable for allowing the interlayer coupling magnetic field (Hin) to come close to zero A/m.

As shown in FIG. 14, it was shown that the interlayer coupling magnetic field (Hin) comes more close to zero A/m when the thickness of the Cr layer is 20 Å or more.

The interlayer coupling magnetic field (Hin) can be suppressed to 400 A/m or less by adjusting. the thickness of the Cr layer to 30 Å or more.

From the experimental results as hitherto described, the thickness of the Cr layer was determined to be 15 Å or more and 50 Å or less in the present invention when the [Ta/Cr] underlayer was used. The thickness within this range permits the rate of change of resistance of 10% or more and the unidirectional exchange bias magnetic field (Hex*) of about $11.85 \times 10^4$ A/m to be obtained. The interlayer coupling magnetic field (Hin) may be also reduced.

More preferably, the thickness of the Cr layer is adjusted to 15 Å or more and 40 Å or less in order to reliably obtain the rate of change of resistance of 10% or more.

Further preferably, the thickness of the Cr layer is adjusted to 20 Å or more and 28 Å or less. This permits the rate of change of resistance to be 12% or more while increasing the unidirectional exchange bias magnetic field (Hex*) to about $15.8 \times 10^4$ A/m.

The Cr layer is preferably formed with a thickness of 15 Å or more and 50 Å or less when no Ta layer is provided, since a rate of change of resistance of 10% or more as well as a unidirectional exchange bias magnetic field (Hex*) of about $11.85 \times 10^4$ A/m may be obtained while reducing the interlayer coupling magnetic field.

It is preferable to form the Cr layer with a thickness of 25 Å or more and 40 Å or less for reliably obtaining a rate of change of resistance of 10% or more.

More preferably, the Cr layer is formed with a thickness of 30 Å or more and 40 Å or less. This enables the rate of change of resistance of 10% or more to be obtained while increasing the unidirectional exchange bias magnetic field to about $15.8 \times 10^4$ A/m or more. The interlayer coupling magnetic field may be suppressed to 400 A/m or less.

As hitherto described, the exchange coupling film according to the present invention comprises a seed layer formed of Cr having a thickness of 15 Å or more and 50 Å or less, and an amorphous phase is incorporated in at least a part of the seed layer.

Wettability of the surface of the seed layer can be remarkably improved in the seed layer according to the present invention as compared with the conventional seed layer formed of a NiFeCr alloy. Consequently, each layer deposited on the seed layer such as an antiferromagnetic layer is readily grown as lamellae with a larger crystal grain diameter than that in the related art. Moreover, the unidirectional exchange bias magnetic field (Hex*) as well as the blocking temperature of the ferromagnetic layer may be enhanced as compared with the ferromagnetic layer formed on the seed layer made of the NiFeCr alloy.

Increasing the unidirectional exchange bias magnetic field as well as the blocking temperature permits magnetization of the ferromagnetic layer to be properly pinned in a desired direction even when the element suffers a high temperature. In addition, grain boundary diffusion between the layers occurring in a high temperature environment can be suppressed, thereby enabling electromigration resistance represented by electron migration resistance to be properly improved.

Undulations on each layer formed on the seed layer can be suppressed from being generated while properly improving surface lubricity on the surface in the present invention, because wettability of the surface of the seed layer is markedly improved by forming the seed layer with Cr, and an amorphous phase is incorporated in at least a part of the seed layer.

When the exchange coupling film is used as the magnetic sensing element according to the present invention, the interlayer coupling magnetic field (Hin) gene-rated by static magnetic coupling (topological coupling) between the pinned magnetic layer (ferromagnetic layer) and free magnetic layer can be weakened while reducing asymmetry of the regenerative waveform. When a specular reflection layer is formed, on the other hand, the rate of change of resistance can be improved by improving specular reflectivity of the specular reflection layer.

According to the exchange coupling film and magnetic sensing element using the exchange coupling film in the present invention, wettability of the seed layer is remarkably improved while improving lubricity of the surface of each layer formed on the seed layer. Consequently, the unidirectional exchange bias magnetic field (Hex*) is more increased as compared with that in the related art, thereby enabling electromigration resistance may be improved for complying with high density recording in the future while enabling stability of the regenerative waveform and the rate of change of resistance to be improved.

What is claimed is:

1. An exchange coupling film comprising a seed layer, an antiferromagnetic layer and a ferromagnetic layer sequentially laminated from bottom to top, a magnetization direction of the ferromagnetic layer being aligned in a prescribed direction by generating an exchange coupling magnetic field at an interface between the antiferromagnetic layer and ferromagnetic layer, wherein the seed layer is formed of Cr, and contains an amorphous phase in at least a part thereof, and wherein crystal grains formed on each layer on the seed layer in a direction parallel to a surface of the seed layer have a mean crystal grain diameter of at least 200 Å.

2. A magnetic sensing element comprising a seed layer, an antiferromagnetic exchange bias layer, a free magnetic layer, a nonmagnetic layer, a pinned magnetic layer, and an antiferromagnetic layer sequentially laminated from bottom to top, a magnetization direction of the free magnetic layer being aligned in a direction intersecting a magnetization of the pinned magnetic layer, wherein the seed layer exchange bias layer and free magnetic layer are formed of the exchange coupling film according to claim 1.

3. A magnetic sensing element according to claim 2, comprising a specular reflection layer additionally formed on the magnetic sensing element.

4. A magnetic sensing element comprising first and second nonmagnetic layers laminated on and under a free magnetic layer, respectively first and second pinned magnetic layers formed on the first nonmagnetic layer and under the second nonmagnetic layer, respectively, and first and second antiferromagnetic layers formed on the first pinned magnetic layer and under the second pinned layer, respectively, a seed layer being formed under the antiferromagnetic layer formed below the free magnetic layer, and a magnetization direction of the free magnetic layer being aligned in a direction intersecting a magnetization of the first pinned magnetic layer, wherein the seed layer, and the antiferromagnetic layer and pinned magnetic layer bonded thereon are formed of the exchange coupling film according to claim 1.

5. The magnetic sensing element according to claim 4, wherein a specular reflection layer is further formed on the magnetic sensing element.

6. A magnetic sensing element having a seed layer, an antiferromagnetic exchange bias layer, a magnetoresistive layer, a nonmagnetic layer and a soft magnetic layer sequentially laminated from bottom to top, wherein the seed layer, exchange bias layer and magnetoresistive layer are formed of the exchange coupling film according to claim 1.

7. An exchange coupling film comprising a seed layer, an antiferromagnetic layer and a ferromagnetic layer sequentially laminated from bottom to top, a magnetization direction of the ferromagnetic layer being aligned in a prescribed direction by generating an exchange coupling magnetic field at an interface between the antiferromagnetic layer and ferromagnetic layer, wherein the seed layer is formed of Cr, and contains an amorphous phase in at least a part thereof, and wherein crystal grain boundaries formed in the antiferromagnetic layer exposed on a cut face by cutting the exchange coupling film in a direction parallel to a film thickness direction, and crystal grain boundaries formed in the ferromagnetic layer are discontinuous with each other at least at a part of the interface between the antiferromagnetic layer and ferromagnetic layer.

8. A magnetic sensing element comprising a seed layer, an antiferromagnetic exchange bias layer, a free magnetic layer, a nonmagnetic layer, a pinned magnetic layer, and an antiferromagnetic layer sequentially laminated from bottom to top, a magnetization direction of the free magnetic layer being aligned in a direction intersecting a magnetization of the pinned magnetic layer, wherein the seed layer, exchange bias layer and free magnetic layer are formed of the exchange coupling film according to claim 7.

9. A magnetic sensing element according to claim 8, comprising a specular reflection layer additionally formed on the magnetic sensing element.

10. A magnetic sensing element comprising first and second nonmagnetic layers laminated on and under a free magnetic layer, respectively first and second pinned magnetic layers formed on the first nonmagnetic layer and under the second nonmagnetic layer, respectively, and first and second antiferromagnetic layers formed on the first pinned magnetic layer and under the second pinned layer, respectively, a seed layer being formed under the antiferromagnetic layer formed below the free magnetic layer, and a magnetization direction of the free magnetic layer being aligned in a direction intersecting a magnetization of the first pinned magnetic layer, wherein the seed layer, and the antiferromagnetic layer and pinned magnetic layer bonded thereon are formed of the exchange coupling film according to claim 7.

11. The magnetic sensing element according to claim 10, wherein a specular reflection layer is further formed on the magnetic sensing element.

12. A magnetic sensing element having a seed layer, an antiferromagnetic exchange bias layer, a magnetoresistive layer, a nonmagnetic layer and a soft magnetic layer sequentially laminated from bottom to top, wherein the seed layer, exchange bias layer and magnetoresistive layer are formed of the exchange coupling film according to claim 7.

13. An exchange coupling film comprising a seed layer, an antiferromagnetic layer and a ferromagnetic layer sequentially laminated from bottom to top, a magnetization direction of the ferromagnetic layer being aligned in a prescribed direction by generating an exchange coupling magnetic field at an interface between the antiferromagnetic layer and ferromagnetic layer, wherein the seed layer is formed of Cr, and contains an amorphous phase in at least a part thereof, and wherein the crystal grain boundaries formed in the antiferromagnetic layer exposed on a cut face by cutting the exchange coupling film in a direction parallel to a film thickness direction, and crystal grain boundaries formed in the seed layer are discontinuous with each other at least at a part of an interface between the antiferromagnetic layer and seed layer.

14. A magnetic sensing element comprising a seed layer, an antiferromagnetic exchange bias layer, a free magnetic layer, a nonmagnetic layer, a pinned magnetic layer, and an antiferromagnetic layer sequentially laminated from bottom to top, a magnetization direction of the free magnetic layer being aligned in a direction intersecting a magnetization of the pinned magnetic layer, wherein the seed layer, exchange bias layer and free magnetic layer are formed of the exchange coupling film according to claim 13.

15. A magnetic sensing element according to claim 14, comprising a specular reflection layer additionally formed on the magnetic sensing element.

16. A magnetic sensing element comprising first and second nonmagnetic layers laminated on and under a free magnetic layer, respectively first end second pinned magnetic layers formed on the first nonmagnetic layer and under the second nonmagnetic layer, respectively, and first and second antiferromagnetic layers formed on the first pinned magnetic layer and under the second pinned layer, respectively, a seed layer being formed under the antiferromagnetic layer formed below the free magnetic layer, and a magnetization direction of the free magnetic layer being aligned in a direction intersecting a magnetization of the first pinned magnetic layer, wherein the seed layer, and the antiferromagnetic layer and pinned magnetic layer bonded thereon are formed of the exchange coupling film according to claim 13.

17. The magnetic sensing element according to claim 16, wherein a specular reflection layer is further formed on the magnetic sensing element.

18. A magnetic sensing element having a seed layer, an antiferromagnetic exchange bias layer, a magnetoresistive layer, a nonmagnetic layer and a soft magnetic layer sequentially laminated from bottom to top, wherein the seed layer, exchange bias layer and magnetoresistive layer are formed of the exchange coupling film according to claim 13.

19. An exchange coupling film comprising a seed layer, an antiferromagnetic layer and a ferromagnetic layer sequentially laminated from bottom to top, a magnetization direction of the ferromagnetic layer being aligned in a prescribed direction by generating an exchange coupling magnetic field at an interface between the antiferromagnetic layer and ferromagnetic layer, wherein the seed layer is formed of Cr, and contains an amorphous phase in at least a part thereof, and wherein twin crystals are formed at least in a part of the antiferromagnetic layer, and twin crystal boundaries are formed at least in a part of the twin crystal to be non-parallel to an interface between the antiferromagnetic layer and seed layer.

20. A magnetic sensing element comprising a seed layer, an antiferromagnetic exchange bias layer, a free magnetic layer, a nonmagnetic layer, a pinned magnetic layer, and an antiferromagnetic layer sequentiality laminated from bottom to top, a magnetization direction of the free magnetic layer being aligned in a direction intersecting a magnetization of the pinned magnetic layer, wherein the seed layer, exchange bias layer and free magnetic layer are formed of the exchange coupling film according to claim 19.

21. A magnetic sensing element according to claim 20, comprising a specular reflection layer additionally formed on the magnetic sensing element.

22. A magnetic sensing element comprising first and second nonmagnetic layers laminated on and under a free magnetic layer, respectively first and second pinned magnetic layers formed on the first nonmagnetic layer and under the second nonmagnetic layer, respectively, and first and second antiferromagnetic layers formed on the first pinned magnetic layer and under the second pinned layer, respectively, a seed layer being formed under the antiferromagnetic layer formed below the free magnetic layer, and a magnetization direction of the free magnetic layer being aligned in a direction intersecting a magnetization of the first pinned magnetic layer, wherein the seed layer, and the antiferromagnetic layer and pinned magnetic layer bonded thereon are formed of the exchange coupling film according to claim 19.

23. The magnetic sensing element according to claim 22, wherein a specular reflection layer is further formed on the magnetic sensing element.

24. A magnetic sensing element having a seed layer, an antiferromagnetic exchange bias layer, a magnetoresistive layer, a nonmagnetic layer and a soft magnetic layer sequentially laminated from bottom to top, wherein the seed layer, exchange bias layer and magnetoresistive layer are formed of the exchange coupling film according to claim 19.

25. An exchange coupling film comprising a seed layer, an antiferromagnetic layer and a ferromagnetic layer sequentially laminated from bottom to top, a magnetization direction or the ferromagnetic layer being aligned in a prescribed direction by generating an exchange coupling magnetic field at an interface between the antiferromagnetic layer and ferromagnetic layer, wherein the seed layer is formed of Cr, and contains an amorphous phase in at least a part thereof, wherein the antiferromagnetic layer comprises a X—Mn—X' alloy, X' being at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb and rare earth elements, and wherein the X—Mn—X' alloy is one of an invasion type solid solution comprising the element X' that invaded in interstices formed in a space lattice comprising the element X and Mn, and a substitution type solid solution in which a part of the lattice points composed of the element X and Mn are substituted with the element X'.

26. A magnetic sensing element comprising a seed layer, an antiferromagnetic exchange bias layer, a free magnetic layer, a nonmagnetic layer, a pinned magnetic layer, and an antiferromagnetic layer sequentially laminated from bottom to top, a magnetization direction of the free magnetic layer being aligned in a direction intersecting a magnetization of the pinned magnetic layer, wherein the seed layer, exchange bias layer and free magnetic layer are formed of the exchange coupling film according to claim 25.

27. A magnetic sensing element according to claim 26, comprising a specular reflection layer additionally formed on the magnetic sensing element.

28. A magnetic sensing element comprising first and second nonmagnetic layers laminated on and under a free magnetic layer, respectively first and second pinned magnetic layers formed on the first nonmagnetic layer and under the second nonmagnetic layer, respectively, and first and second antiferromagnetic layers formed on the first pinned magnetic layer and under the second pinned layer, respectively, a seed layer being formed under the antiferromagnetic layer formed below the free magnetic layer, and a magnetization direction of the free magnetic layer being aligned in a direction intersecting a magnetization of the first pinned magnetic layer, wherein the seed layer, and the antiferromagnetic layer and pinned magnetic layer bonded thereon are formed of the exchange coupling film according to claim 25.

29. The magnetic sensing element according to claim 28, wherein a specular reflection layer is further formed on the magnetic sensing element.

30. A magnetic sensing element having a seed layer, an antiferromagnetic exchange bias layer, a magnetoresistive layer, a nonmagnetic layer and a soft magnetic layer sequentially laminated from bottom to top, wherein the seed layer, exchange bias layer and magnetoresistive layer are formed of the exchange coupling film according to claim 25.

* * * * *